United States Patent [19]

Pribat et al.

[11] Patent Number: 4,999,314
[45] Date of Patent: Mar. 12, 1991

[54] METHOD FOR MAKING AN ALTERNATION OF LAYERS OF MONOCRYSTALLINE SEMICONDUCTING MATERIAL AND LAYERS OF INSULATING MATERIAL

[75] Inventors: Didier Pribat, Paris; Léonidas Karapiperis, Bourg-la-Reine, both of France

[73] Assignee: Thomson-CSF, Puteaux, France

[21] Appl. No.: 333,016

[22] Filed: Apr. 4, 1989

[30] Foreign Application Priority Data

Apr. 5, 1988 [FR] France ................................. 88 04438

[51] Int. Cl.⁵ ............................................. H01L 21/20
[52] U.S. Cl. ............................. 437/89; 148/DIG. 26; 148/DIG. 50; 156/613; 437/69; 437/80; 437/81; 437/83; 437/99; 437/976
[58] Field of Search .................. 148/DIG. 26, 50, 97, 148/117, 143, 150, 163; 156/610–615; 427/248.1, 252, 255.1, 255.2; 437/67, 69, 62, 72, 81, 80, 83, 89, 90, 99, 915, 976

[56] References Cited

U.S. PATENT DOCUMENTS

| | | | |
|---|---|---|---|
| 4,131,984 | 1/1979 | Kaplow et al. | 437/90 |
| 4,789,643 | 12/1988 | Kajikawa | 437/81 |
| 4,824,794 | 4/1989 | Tabata et al. | 437/89 |
| 4,837,182 | 6/1989 | Bozler et al. | 437/89 |

FOREIGN PATENT DOCUMENTS

| | | |
|---|---|---|
| 194495 | 9/1986 | European Pat. Off. . |
| 2440075 | 5/1980 | France . |
| 0083063 | 7/1981 | Japan ..................... 437/89 |
| 0061031 | 4/1984 | Japan ..................... 437/89 |
| 0174366 | 7/1988 | Japan ..................... 437/89 |
| 1200534 | 7/1970 | United Kingdom . |

OTHER PUBLICATIONS

Journal of the Electrochemical Society, vol. 129, No. 10, pp. 2303–2306; D. D. Rathman, et al.
Journal of the Electrochemical Society, vol. 132, No. 10, Oct. 1985, pp. 2445–2453; H. Asai, et al.

Primary Examiner—Olik Chaudhuri
Assistant Examiner—William Bunch
Attorney, Agent, or Firm—Oblon, Spivak, McClelland, Maier & Neustadt

[57] ABSTRACT

In a method for the fabrication of a layer of a monocrystalline semiconducting layer on a layer of insulating material, an epitaxial growth is achieved in a cavity closed by layers of dielectric material, using a seed of monocrystalline semiconducting material of a substrate. The growth takes place first of all, vertically, perpendicularly to the seed, and then horizontally in the plane of the cavity. This method thus enables a three-dimensional integration of semiconductor components.

16 Claims, 14 Drawing Sheets

FIG_1
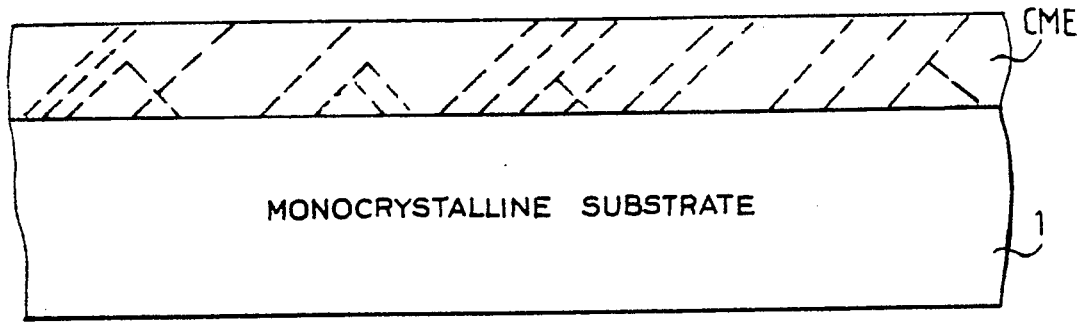
FIG_2
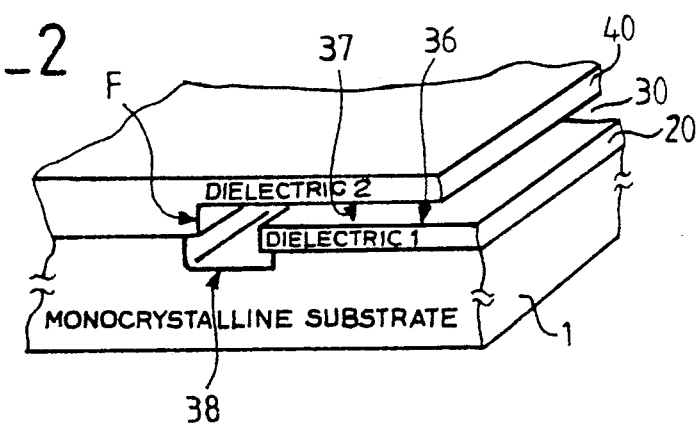
FIG_3
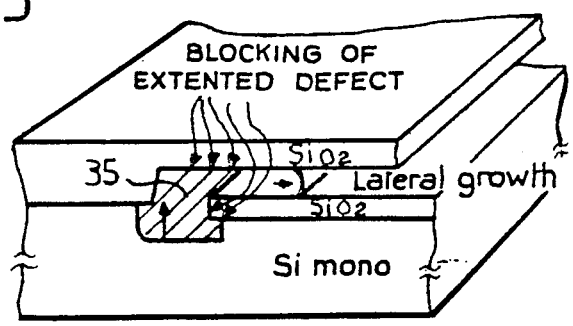

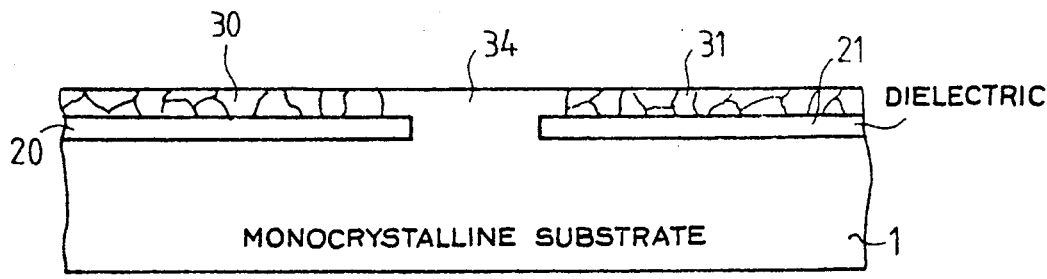
FIG_4
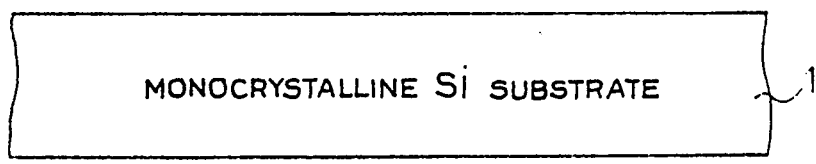
FIG_5
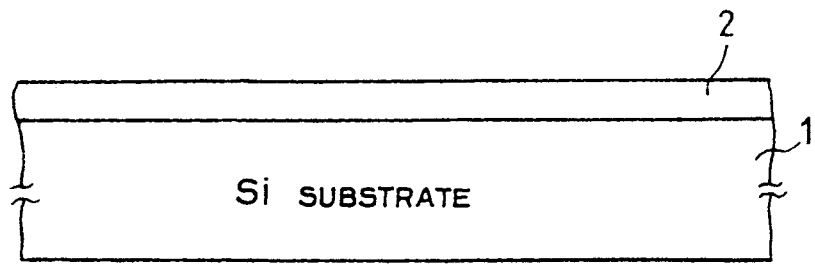
FIG_6
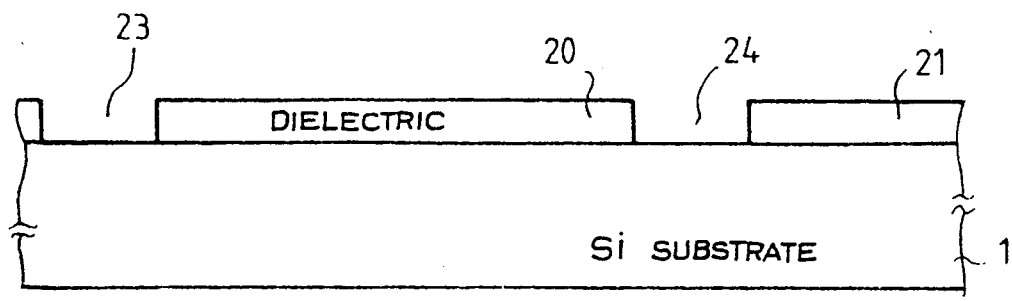
FIG_7

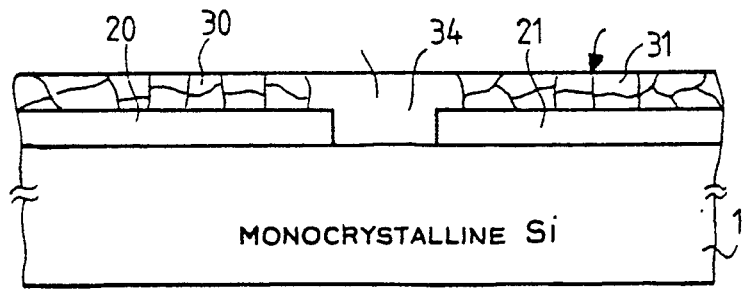
FIG_8
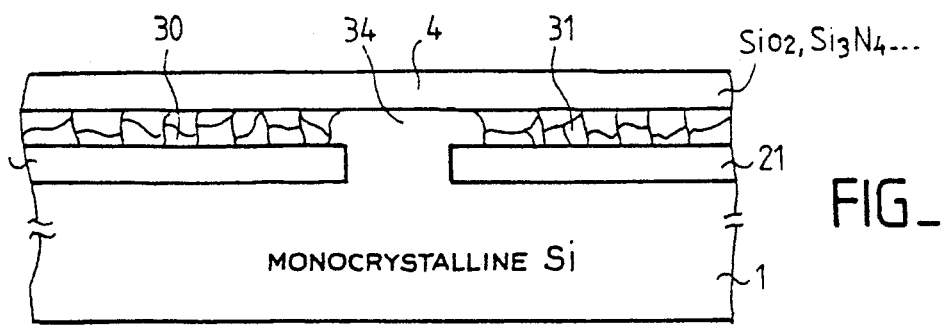
FIG_9
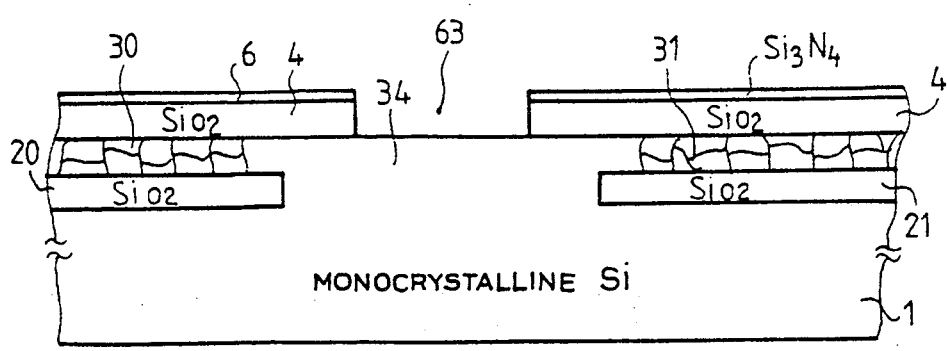
FIG_10
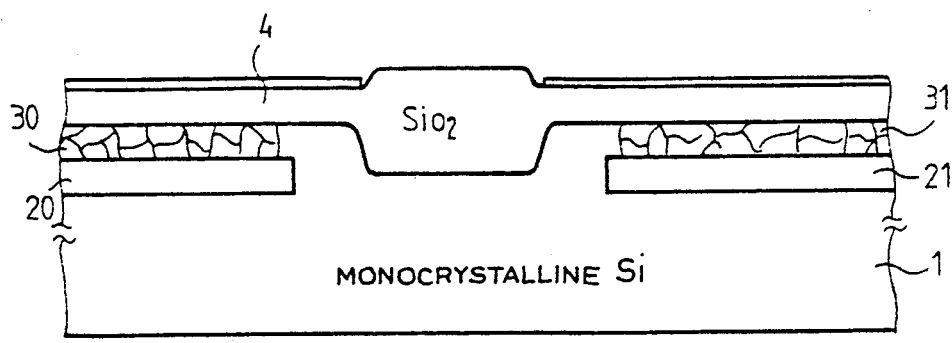
FIG_11

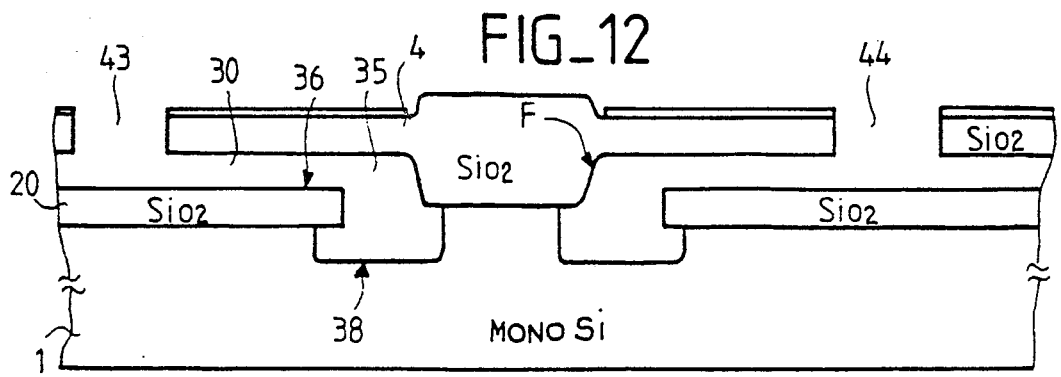
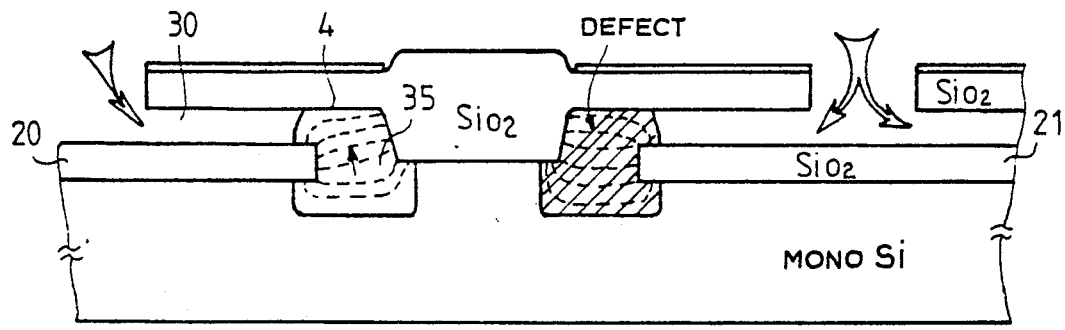
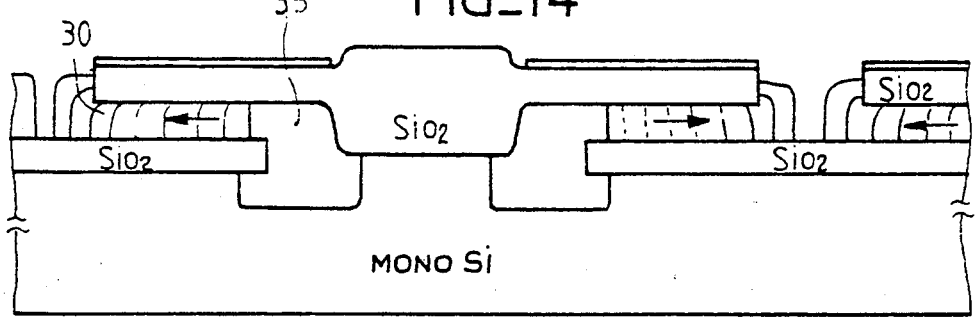
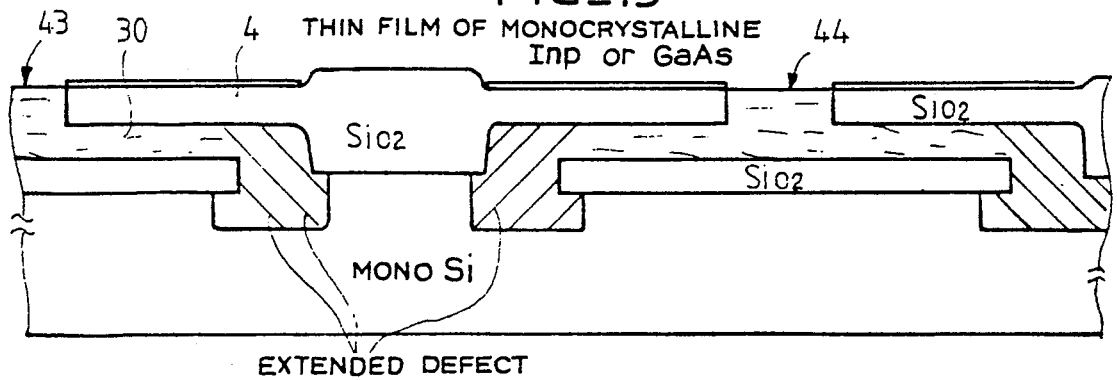

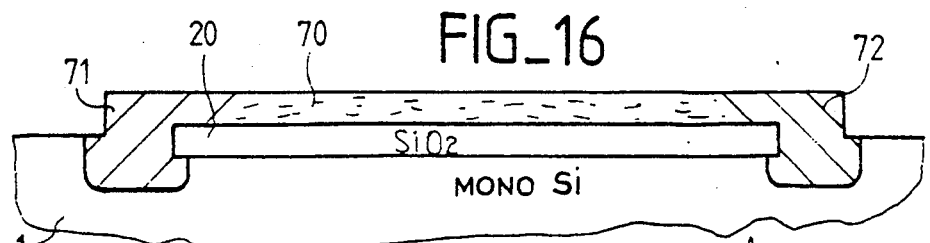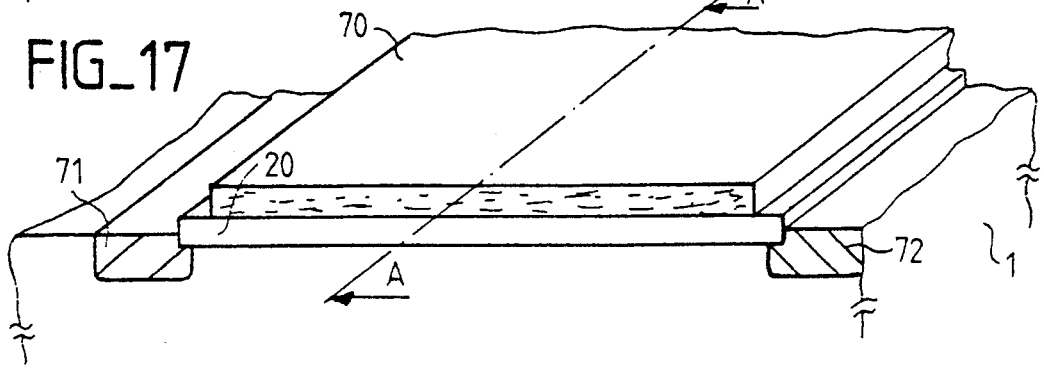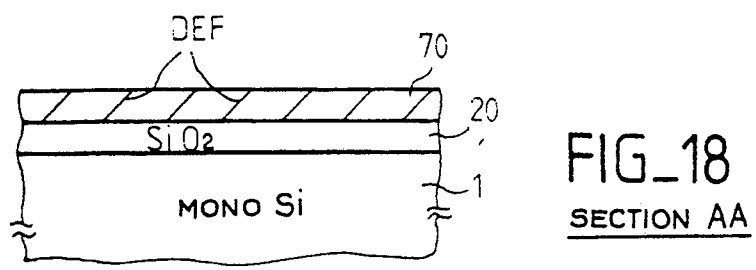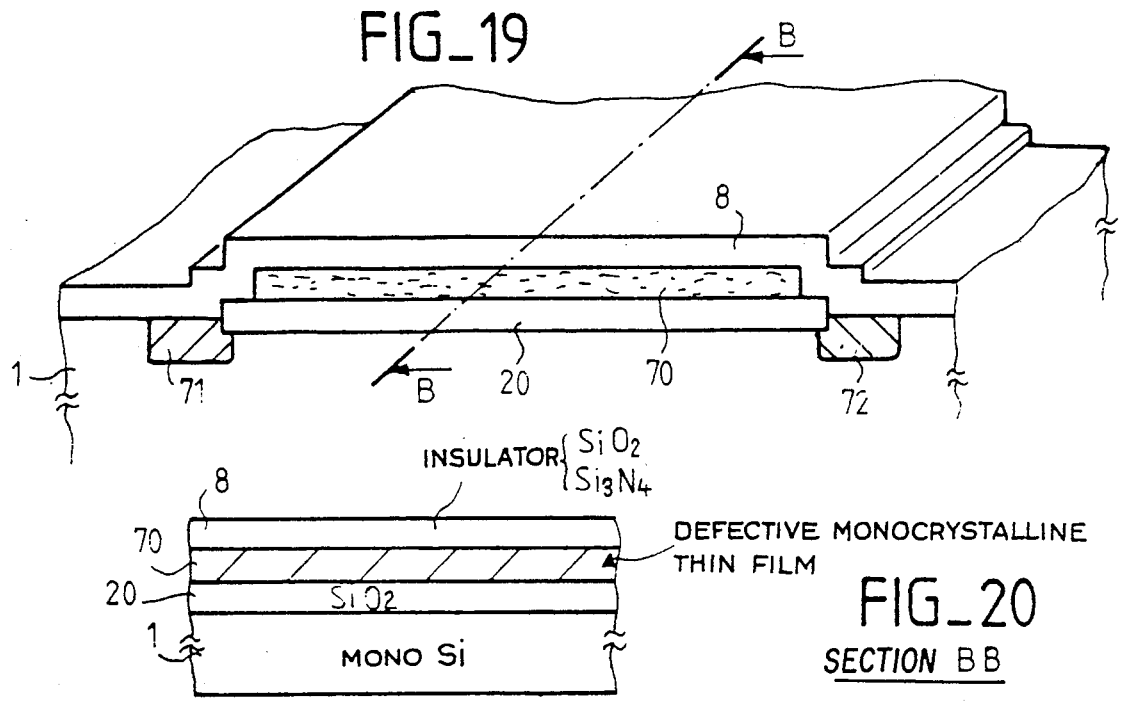

FIG_21
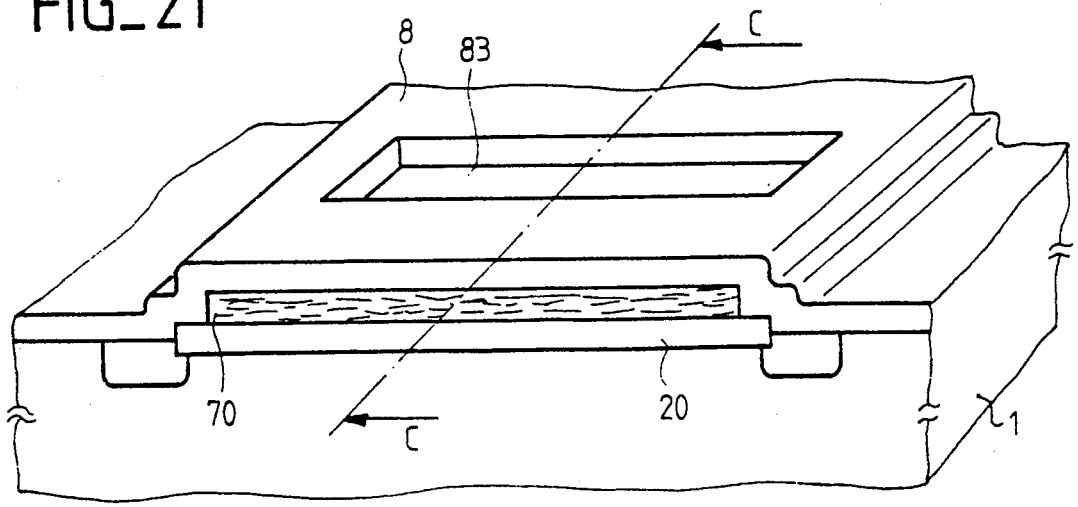
FIG_22
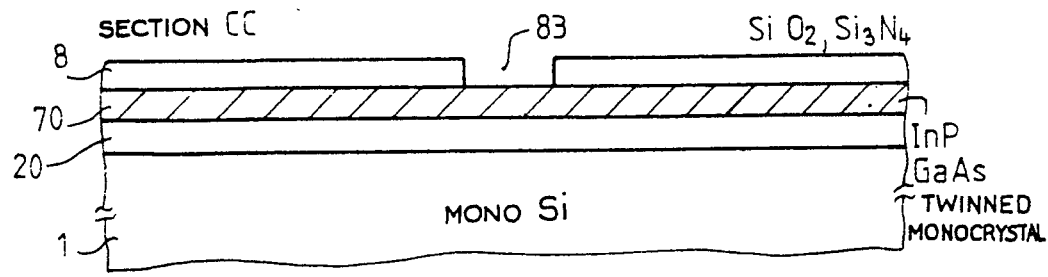
FIG_23
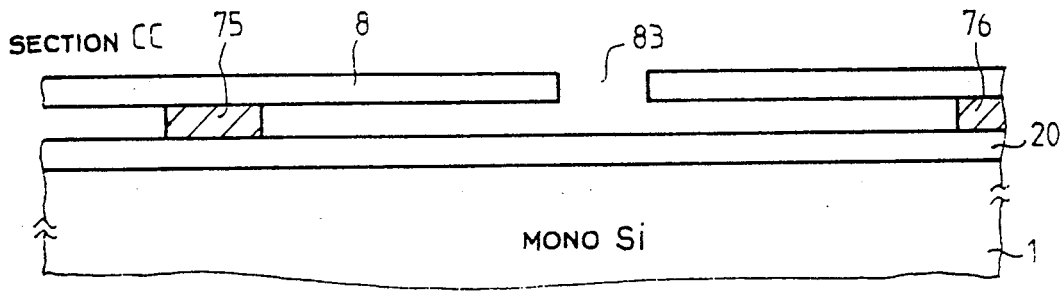
FIG_24
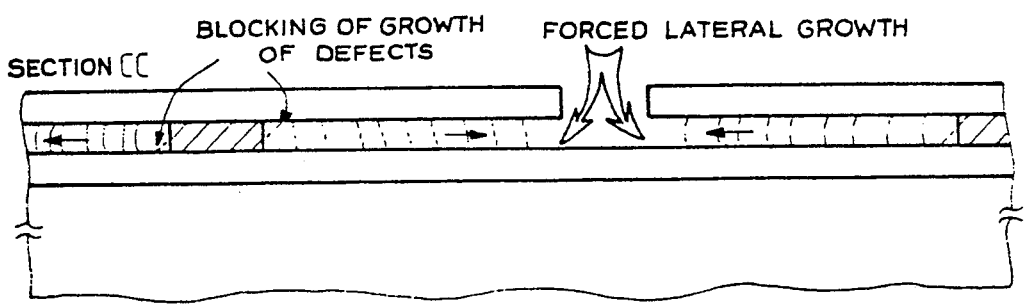

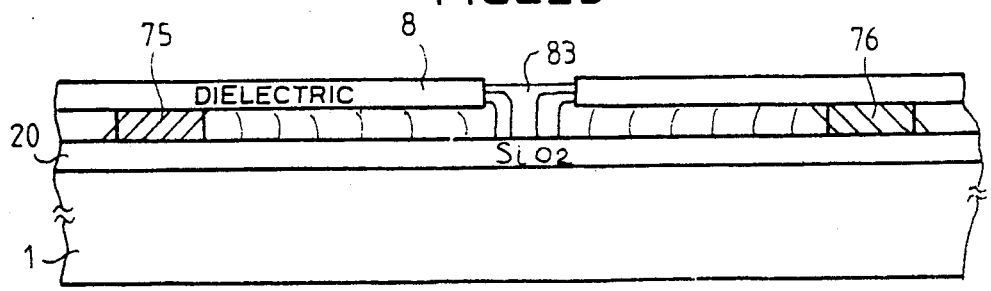
FIG_25
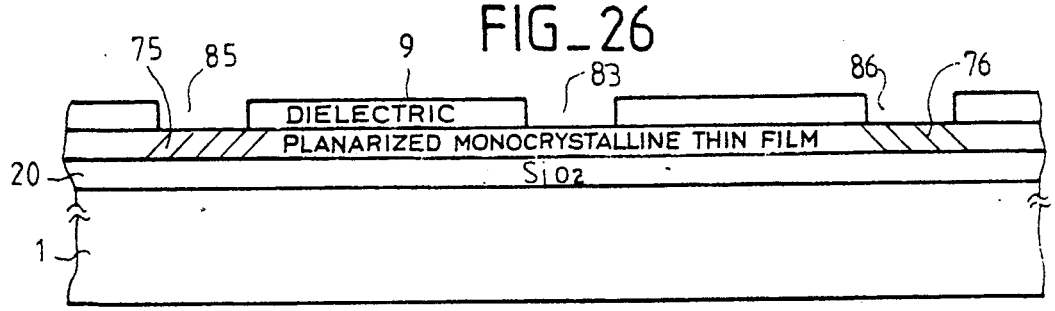
FIG_26
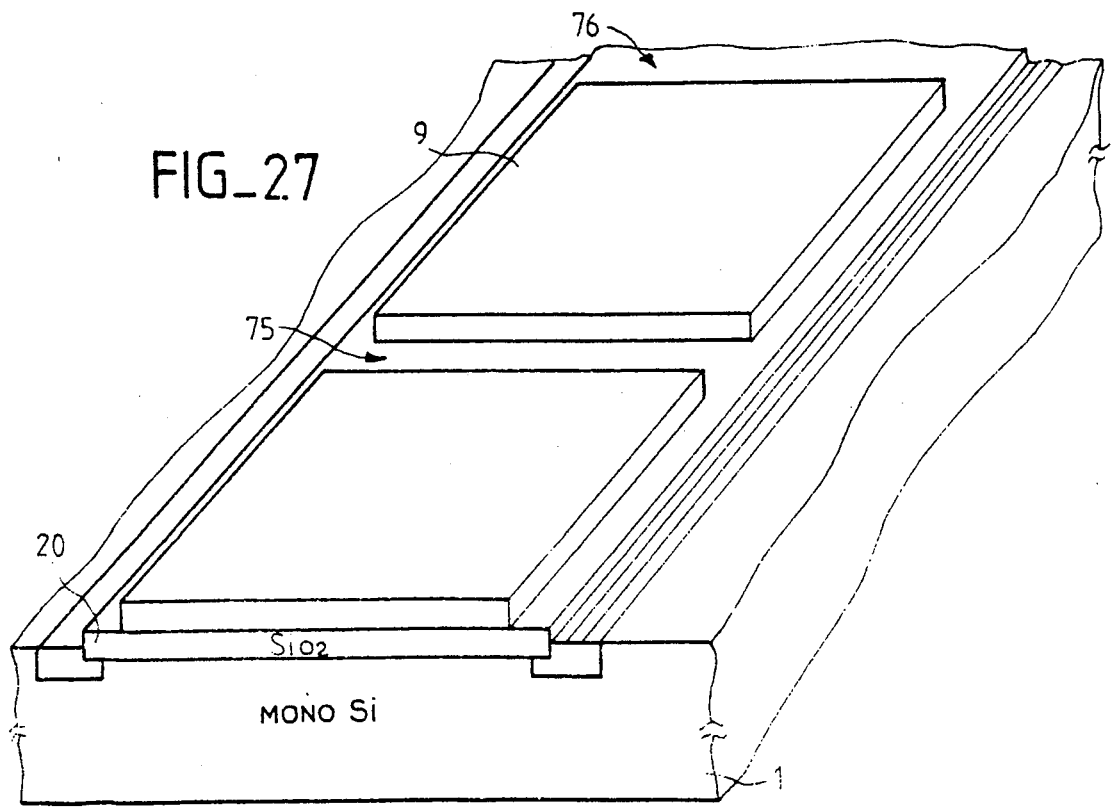
FIG_27

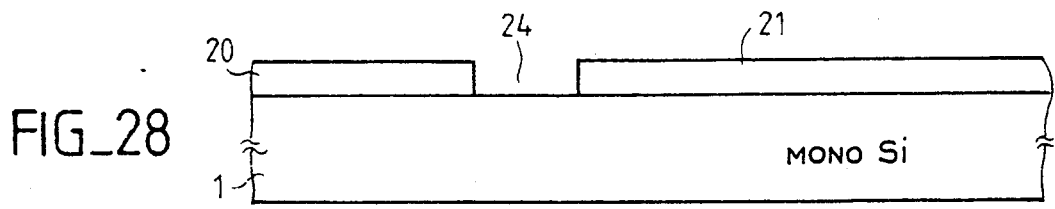
FIG_28
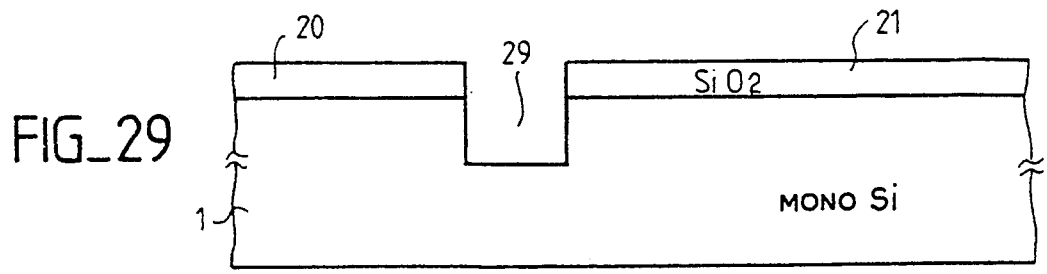
FIG_29
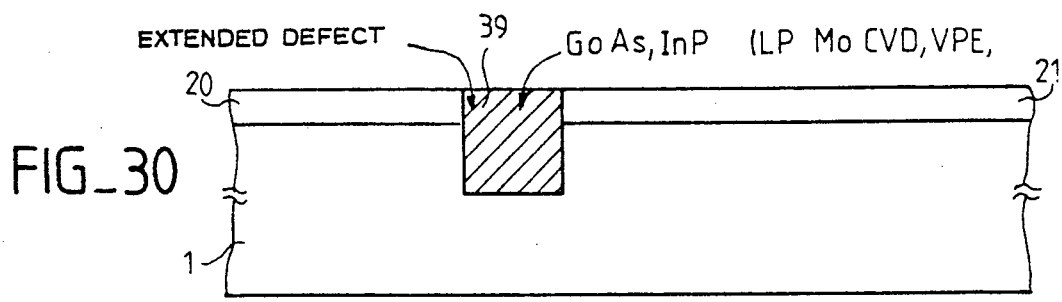
FIG_30
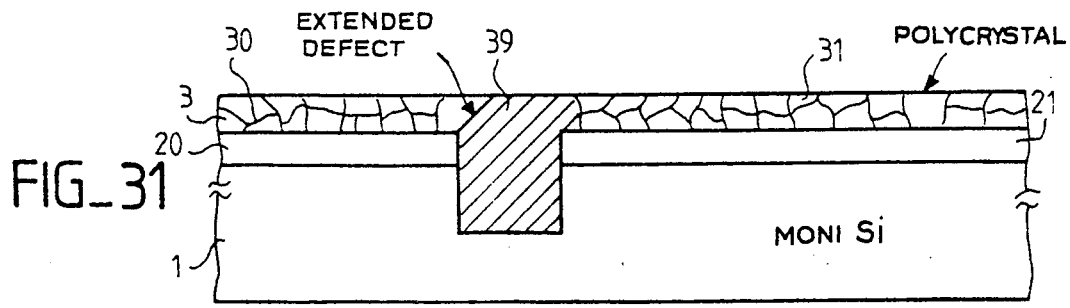
FIG_31
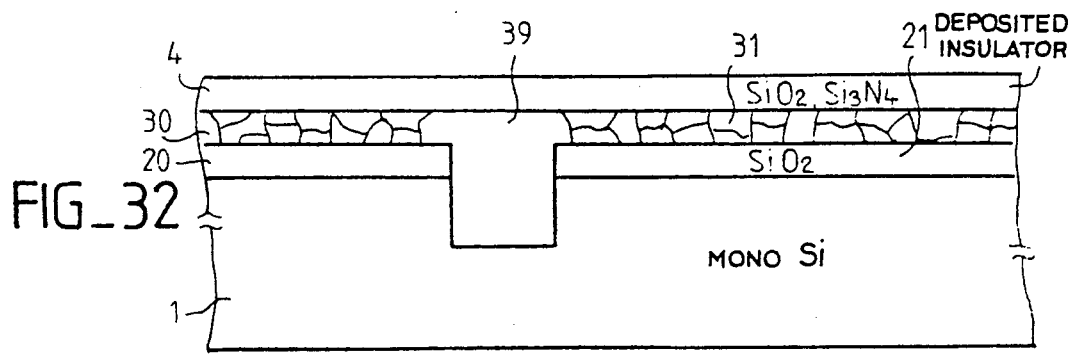
FIG_32

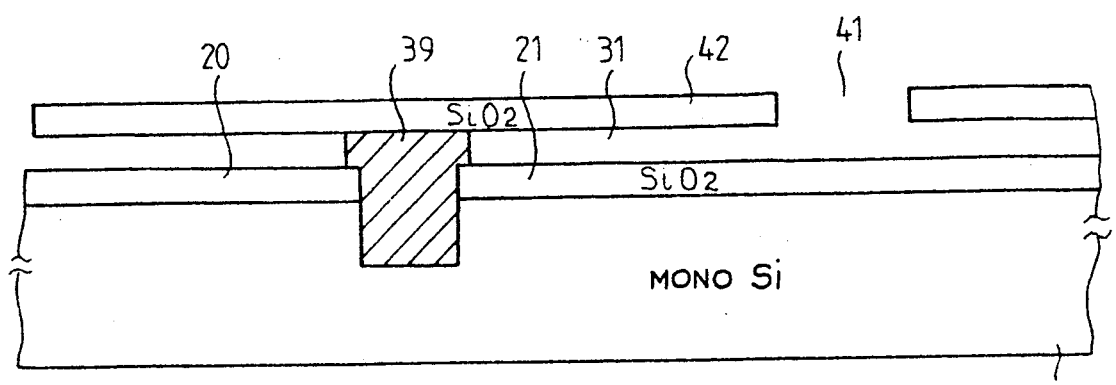
FIG_33
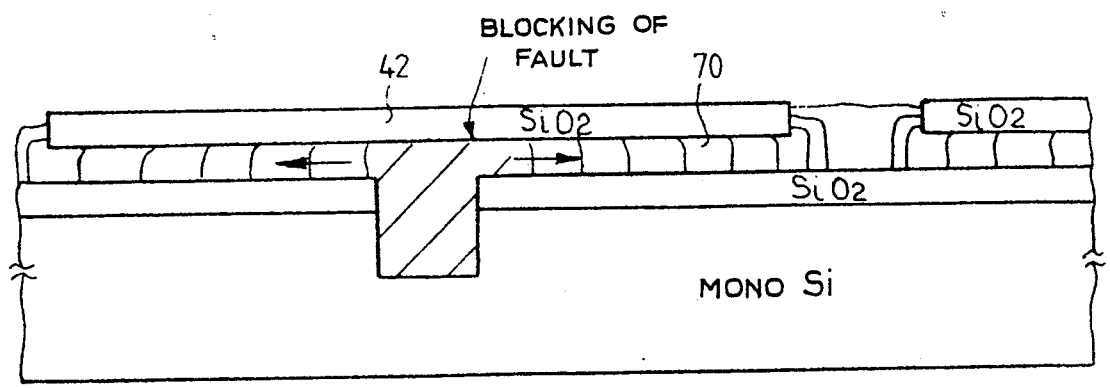
FIG_34
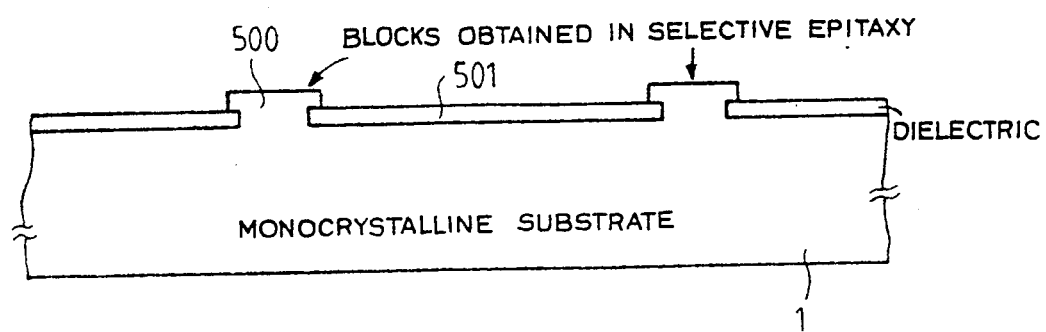
FIG_35

FIG_36
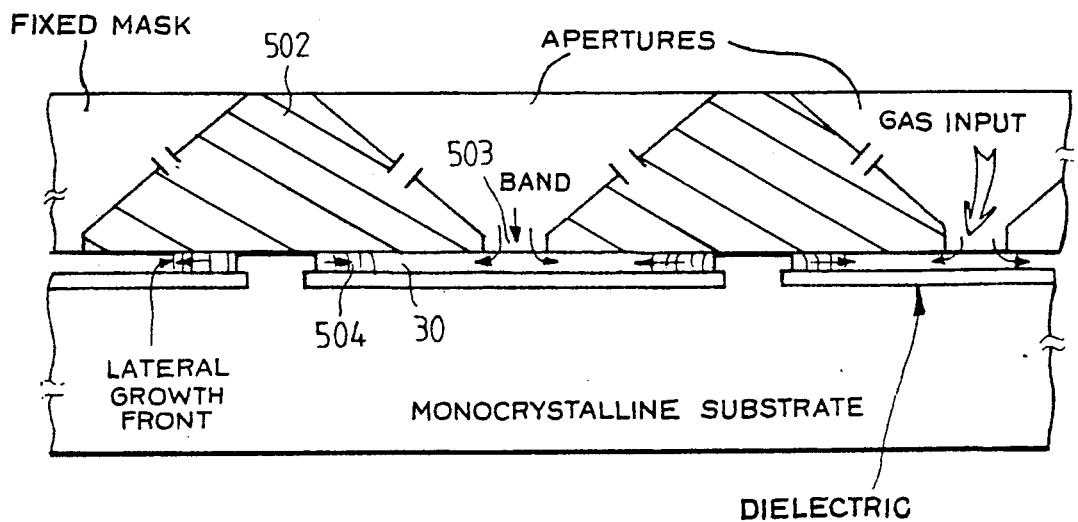
FIG_37
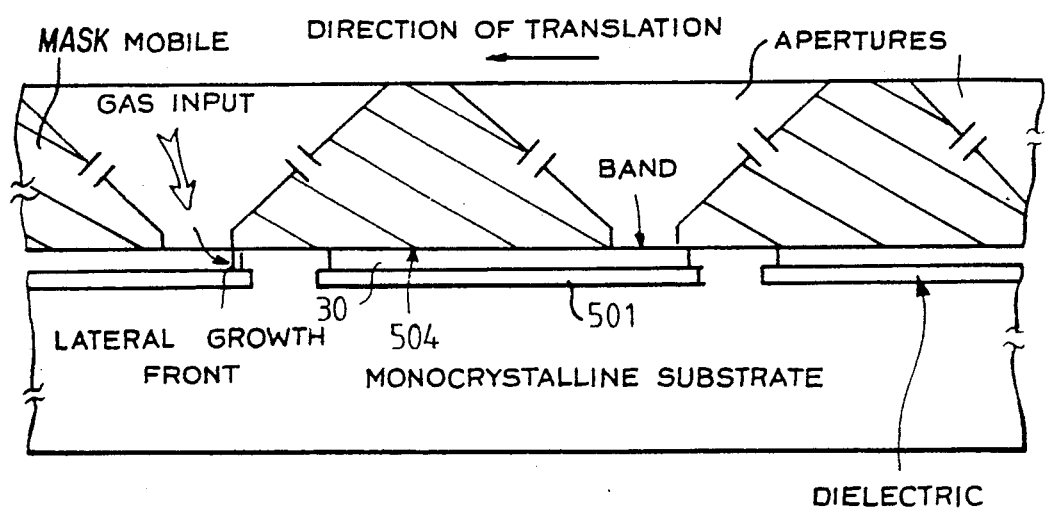

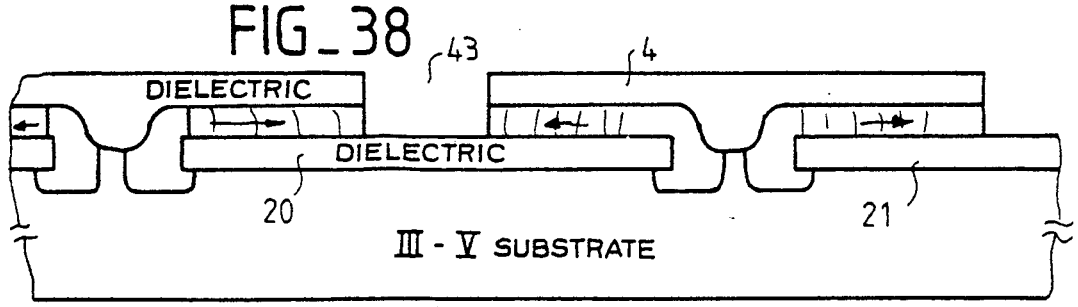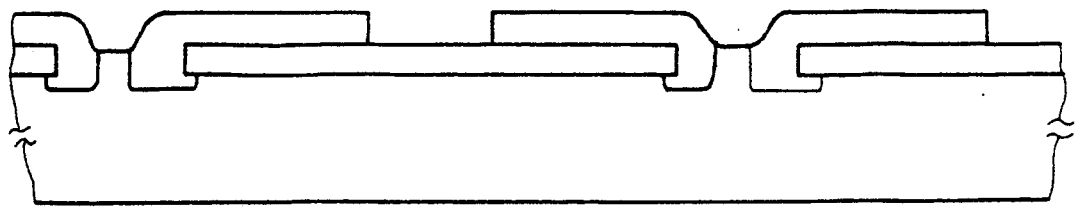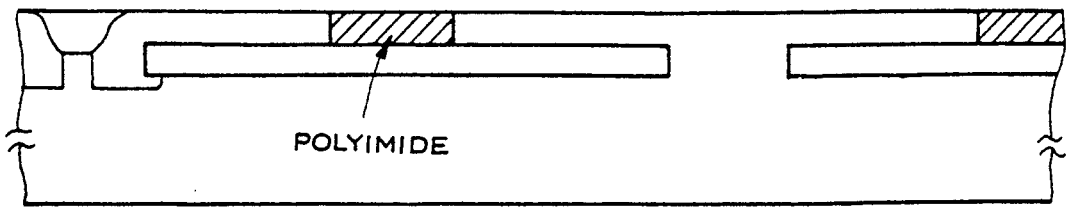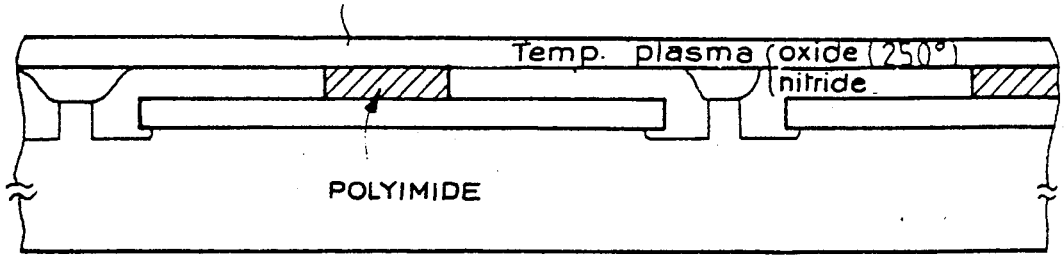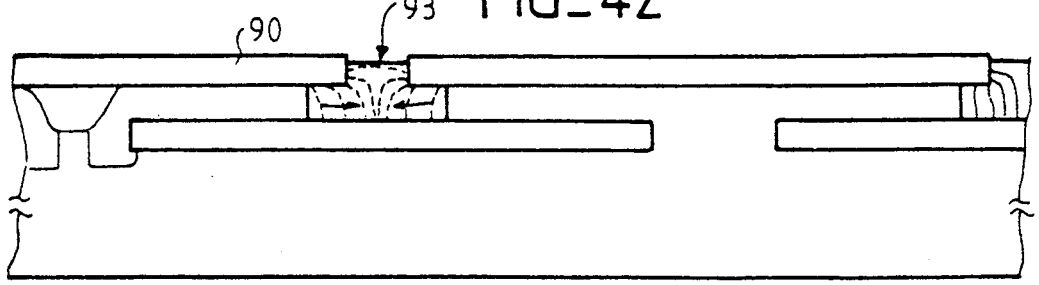

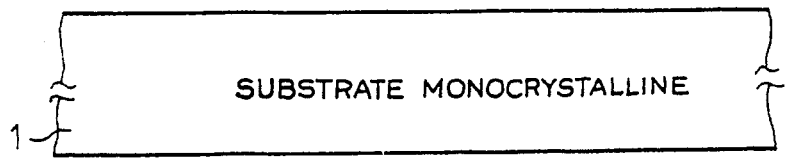
FIG_43
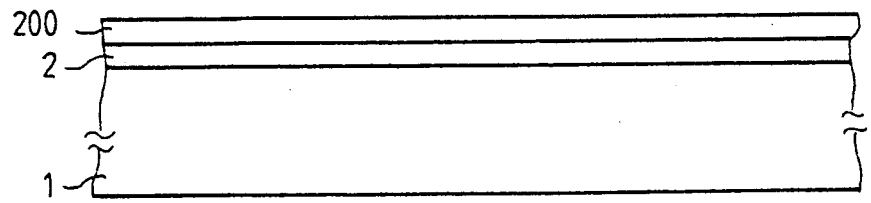
FIG_44
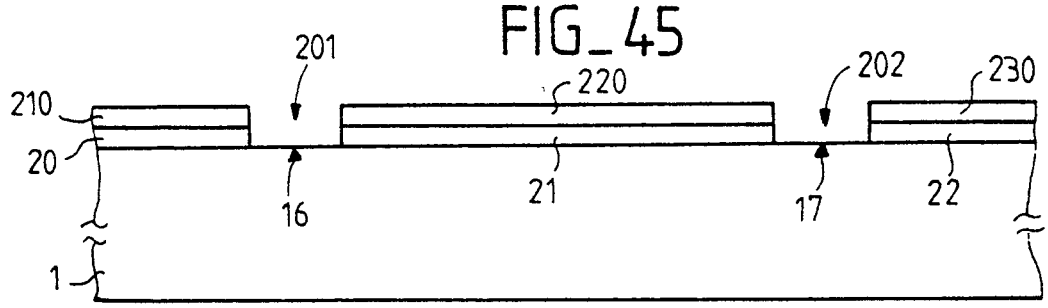
FIG_45
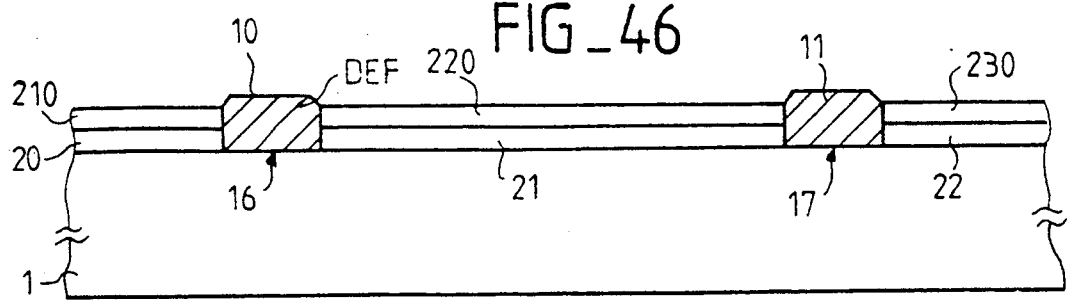
FIG_46
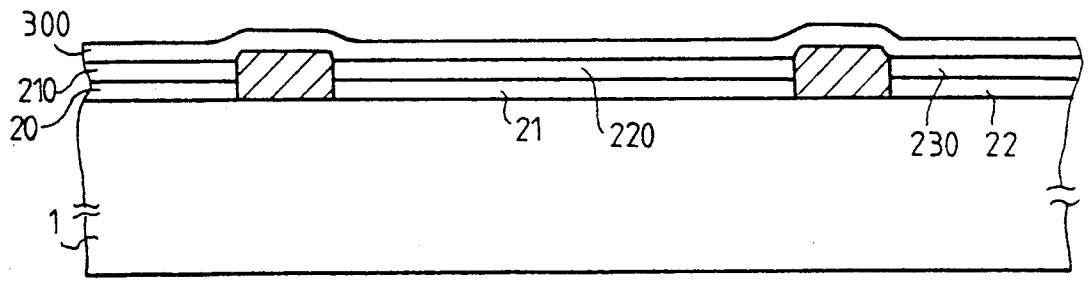
FIG_47

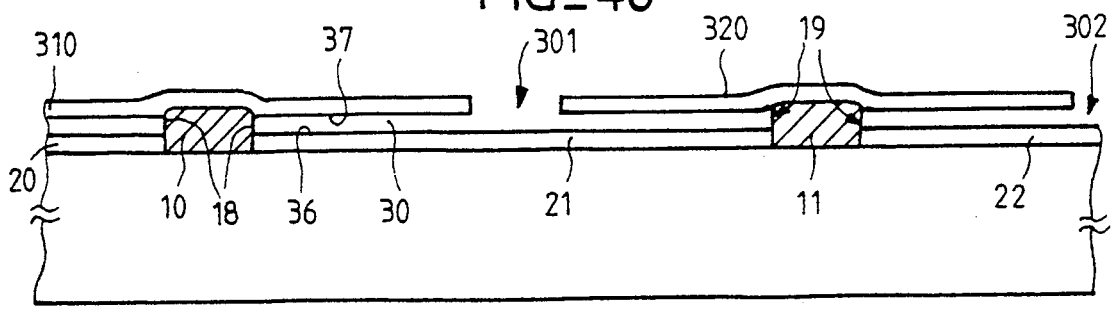
FIG_48
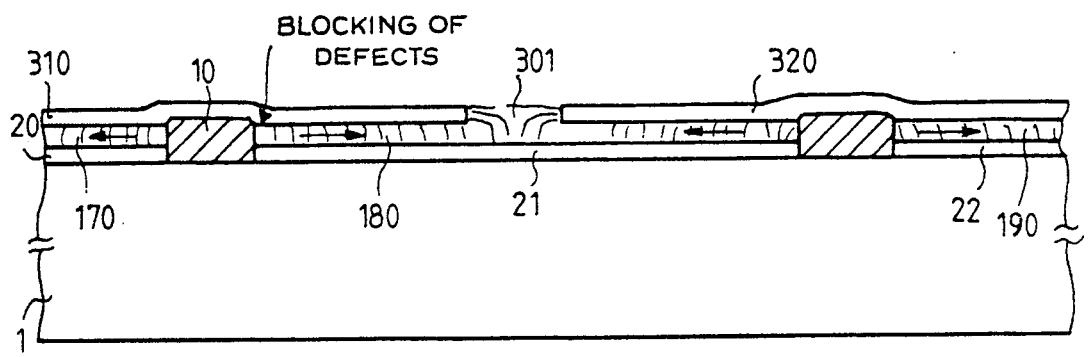
FIG_49
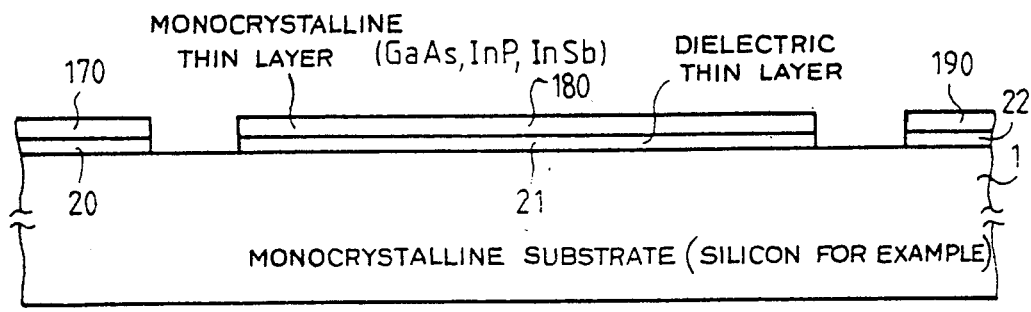
FIG_50

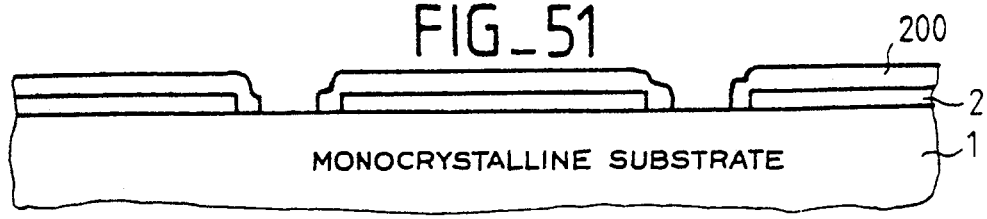
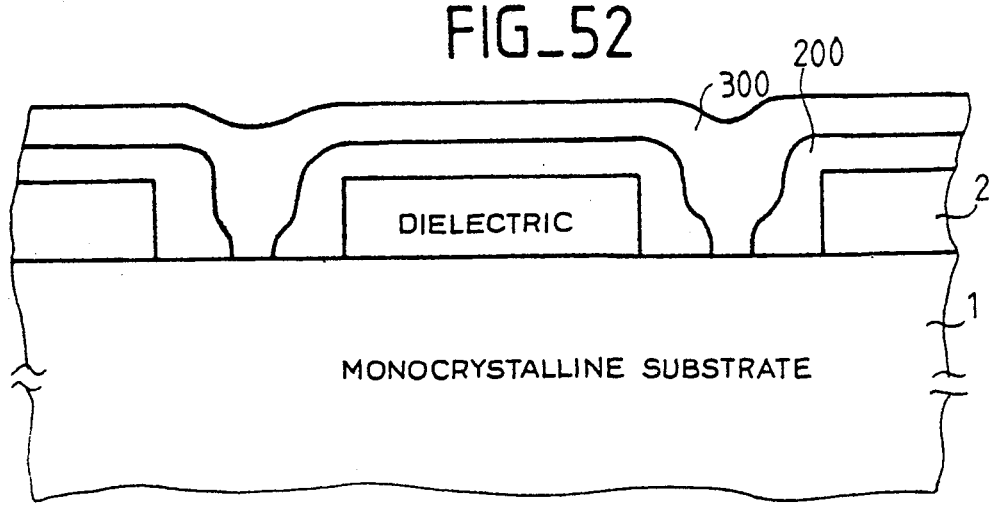
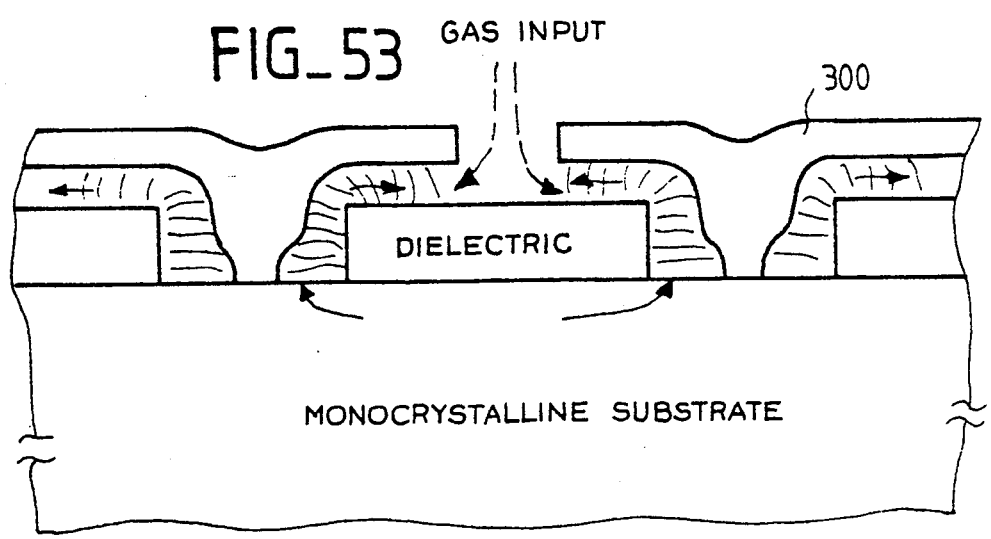
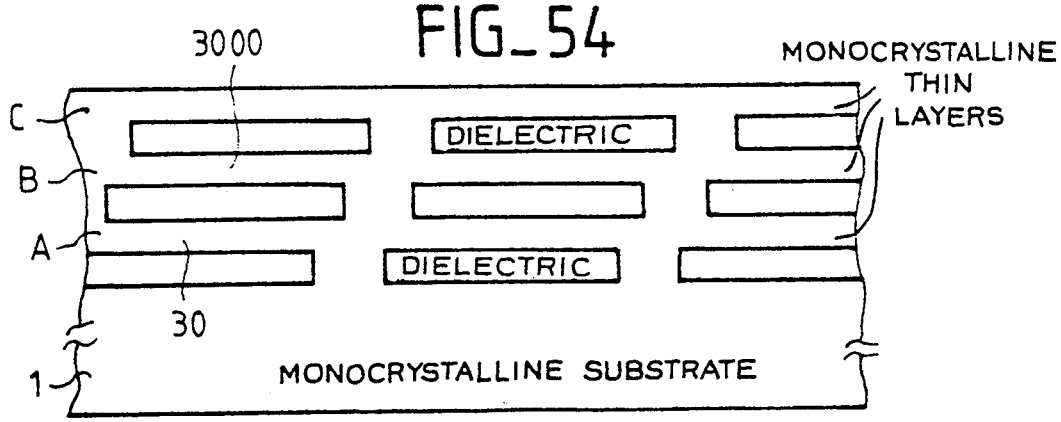

METHOD FOR MAKING AN ALTERNATION OF LAYERS OF MONOCRYSTALLINE SEMICONDUCTING MATERIAL AND LAYERS OF INSULATING MATERIAL

BACKGROUND OF THE INVENTION

1. Field of the Invention

The invention concerns a method for making an alternation of layers of monocrystalline semiconducting material and layers of insulating material or insulator and, notably, a method for making at least one thin layer of a semiconducting material on a layer of insulating material which is itself deposited on a monocrystalline semiconducting substrate, said substrate being a semiconductor which may or may not be different from that of the thin layer so as to obtain a hetero-epitaxial structure.

More particularly, the invention relates to the field of thin layers of a monocrystalline material, epitaxially grown by chemical vapor deposition (CVD) or vapor phase deposition (VPE), on a substrate with a possibly different nature. The method described according to the invention enables, in particular, the removal of two-dimensional extended faults (twins, stacking faults, anti-phase walls in ordered alloys, sub-grain boundaries etc.) as well as linear faults or dislocation lines.

The method shall be described with reference to examples of homo-epitaxy or hetero-epitaxy of semiconducting materials. However, it is quite clear that this method is more general and that its application is not restricted to semiconducting materials alone.

2. Description of the Prior Art

The origin of the extended faults found in thin layers, epitaxially grown by a chemical vapor deposition on a monocrystalline substrate with a different nature and lattice parameter lies essentially in the initial mode of nucleation of the deposit.

Schematically, for chemical vapor deposition, we observe three modes of nucleation and growth of a monocrystalline thin film on an also monocrystalline substrate.

First of all, a layer-by-layer mode of nucleation and growth where the arrangement of the deposited atoms takes place in the exposed atomic plane of the substrate (two-dimensional arrangement), for example by lateral growth at the level of the monolayer from mono-atomic steps which form preferred adsorption sites. When all of the sites of the deposits are saturated on the exposed surface of the substrate, the growth continues at the level of the second monolayer according to the same mechanism and so on, plane by plane. This type of mechanism is observed in cases of homo-epitaxy of course (silicon doped on silicon for example) but also in the case of hetero-epitaxy of metals (Cd or W for example) or semiconductors ($Ga_{1-x}Al_xAs$ on GaAs, GaInAsP on InP...). The extended faults generated during the epitaxy are dislocations of interfaces which release the elastic energy stored in the deposit owing to a possible mismatching of its lattice parameter with that of the substrate. These dislocations get spread in the thickness of the deposit and their total elimination is practically impossible.

The second mode of growth results from a mechanism of nucleation in islands: according to this mechanism, clusters of atoms are formed initially on the surface of the substrate, generally on sites of emerging faults. Those of these clusters which achieve the critical seed size then grow to form condensed face islands. These islands coalesce when they come together in order to form a film which becomes truly continuous only after it has reached a certain thickness. This type of growth is observed when the bonding energy between atoms of the deposit is greater than the bonding energy between atoms of the deposit on the one hand and atoms of the substrate on the other. This is often the case with films of metals or semiconductors on insulating substrates. The faults present in these films consist, firstly, of lines of dislocations (just as above) which enable the mechanical energy due to the mismatching of the lattice to be released and, secondly, of twins which, because of the particular growth mechanism, are generated at the junction between islands in order to adapt to slight disorientations. These twins grow with the film and are, consequently, very difficult to remove. Thus, more than 25 years after the first published work on silicon hetero-epitaxy on a sapphire substrate, we still have to be content with a highly twinned epitaxiated material, and the technology for making the devices from the material in question has to adapt to its poor crystalline quality. In particular, it is impossible to use ionic implantation because, during thermal annealing, the point faults of implantation precipitate on the extended faults and do not heal.

Finally, the third mode of growth observed is a combination of the first two modes described above, i.e. the growth starts in two dimensions (the first example described above) on several monolayers, then islands start appearing according to the above-described second mechanism. In coalescing, these islands will then give birth to a continuous film. Just as in the previous cases, the faults will consist of dislocation lines and twins. The removal of these faults, which can be done only by annihilation (the meeting of two dislocations of opposite Burgers vectors), will be very difficult if it is sought to remain in a reasonable range of deposited thickness. The situation is described in FIG. 1 where the epitaxiated CME thin layer deposited on the substrate 1 has dislocations or else twin planes shown in dashes.

In addition to the other above described faults inherent to the growth mode, there are faults generated by the fact that the deposit is put under stress when cooling, for the expansion coefficients of the substrate and of the deposit are only very rarely matched. This cooling process can generate other dislocations as well as slippage phenomena leading to the formation of stacking faults.

The method according to the invention makes it possible to stop the propagation of most of the above described faults and, consequently, to obtain thin layers of practically perfect crystalline quality. The method according to the invention can also be used to obtain stacks of monocrystalline layers insulated by amorphous or polycrystalline dielectric material.

SUMMARY OF THE INVENTION

The invention therefore concerns a method for making a thin monocrystalline layer of a semiconducting material through crystal growth by chemical vapor deposition, wherein the growth is initiated on at least one seed, the chemical composition of which may possibly be different from that of the semiconducting material of the thin layer to be obtained, said growth being confined within a space located between two layers of confinement made of two materials different from the preceding semiconducting materials in such a way that there can be neither nucleation nor deposition of semiconducting material on the exposed surfaces of these materials of confinement, the interval between the two layers of confinement defining the thickness of the monocrystalline thin layer to be obtained.

BRIEF DESCRIPTION OF THE DRAWING

The various objects and characteristics of the invention will appear more clearly from the following description, given by way of example, in referring to the appended drawings, of which:

FIG. 1 shows a hetero-epitaxiated semiconductor device with dislocations and twin planes;

FIGS. 2 and 3 show simplified exemplary embodiments of the method according to the invention;

FIG. 4 shows an example of a deposition of a semiconducting layer according to the prior art;

FIG. 5 to 16 show different steps for performing the method according to the invention;

FIGS. 17 to 27 show different steps of an improvement of the method according to the invention;

FIGS. 28 to 34 show different steps of an alternative embodiment of the method according to the invention;

FIGS. 35 to 37 show a system which can be used to make monocrystalline thin layers according to the invention;

FIGS. 38 to 42 show another improvement of the method according to the invention;

FIGS. 43 to 50 show another variant of the method according to the invention;

FIG. 51 to 53 show another variant of the method according to the invention;

FIG. 54 shows an application of the invention to a three-dimensional device.

DETAILED DESCRIPTION OF THE INVENTION

The method according to the invention consists in interposing, on the path of growth of the crystal in thin layers to be obtained, a construction or "neck" which will block the growth of the faults described above with reference to FIG. 1.

FIGS. 2 and 3 give a simplified illustration of the basic method of the invention. According to this method, a structure of the type shown in FIG. 2 is made. This structure essentially has a space 30 demarcated by the faces 36 and 37 of two layers 20 and 30. The two layers 20 and 30 are made of a material on which, in view of the deposition conditions used, no deposit observed of the semiconducting material which has to be made to grow. At the bottom of the space 30, there is a portion or seed 38 of a semiconducting material (for example the substrate). More precisely, according to the exemplary embodiment of FIG. 2, the layers 20 and 40 are made on a substrate 1. The seed 38 is then a part of the substrate 1 located beneath the plane of the surface 36 of the layer 20.

Under these conditions, as shown in FIG. 3, a selective epitaxy of a semiconducting material, made in a space 30, gives rise to a monocrystalline growth of the semiconducting material on the seed 38. This growth goes ahead perpendicularly to the plane of the seed 38 (vertically) until it fills the cavity 35, and then moves laterally (horizontally) in the space 30.

If the epitaxiated semiconducting material is different from that of the substrate 1, it can be seen in FIG. 3 that the epitaxial growth takes place first of all vertically in the cavity 35 and then laterally between the bands of dielectric 20 and 40. Thus the faults generated during the vertical growth step (hetero-epitaxy) are blocked by the dielectric layers 20 and 40 during the lateral growth step. Moreover, there is no generation of new faults during this very step of lateral growth because the process has become homo-epitaxial during the lateral growth. Once the faults are blocked, they disappear definitively from the thin layer. In fact, the cavity 35 amounts to a trap for faults.

Furthermore, in the case of homo-epitaxy (for example Si on Si, GaAs on GaAs or InP on InP), the lateral epitaxy method according to the invention enables stacks of monocrystalline thin layers separated by non-monocrystalline dielectric layers to be made easily.

However, as shown in the two FIGS. 2 and 3, the growth of the crystal cannot be done laterally except under conditions such that there is no deposition on the surfaces 36 and 37 of the confinement layers 20 and 40 (selective deposition conditions). Thus, if the substrate is made of silicon and the confinement layers are made of silica, and if a silicon deposition is done using $SiH_4$ or $SiH_2Cl_2$, the different deposition parameters (temperature, partial pressure of $SiH_4$ and HCl, etc.) can be adapted so that the above-mentioned conditions are fulfilled and a lateral epitaxial growth is observed without there being any deposition of polycrystalline Si on the silica for selective epitaxial conditions (see, for example, the article by BORLAND and DROWLEY in *Solid State Technology*, August 1985, pp. 141 and the article by KARAPIPERIS et al. in *Proceedings of the 18th International Conference on Solid State Devices and Materials*, Tokyo 1986, p. 713).

As regards the III–IV compounds, and GaAs in particular, in order to obtain deposition selectivity, preference will be given to a method that enables the achieving of a state close to thermodynamic equilibrium in conditions of slight super-saturation. Thus the method of chemical vapor deposition epitaxy or vapor phase epitaxy (VPE) using chlorides enables operation in conditions of this type. The method uses, firstly, $AsCl_3$ diluted in $H_2$ as gas sources and, secondly, Ga as a solid source. The operation is done in an oven where the temperature of the Ga source is, for example, of the order of 800° C. while the sample on which the work is done is kept at a lower temperature, of the order of 650°–700° C., thus giving the announced condition of slight super-saturation.

As regards InP, the operation is done with a gas source $PH_3$ and HCl in $H_2$ and a solid source In. The sample is placed under temperature of around 700° C. and the In source is heated to a greater temperature, as above.

In using the above-mentioned parameters, selective nucleation is obtained on the exposed crystalline parts of the substrate (surfaces with low nucleation barriers). Subsequently, a deposition is observed on these same exposed parts and no deposition on foreign surfaces with higher nucleation barrier (dielectric surfaces for example, but also metallic surfaces such as tungsten surfaces).

Examples of this deposition selectivity between GaAs and $SiO_2$ and InP and $SiO_2$ can be found by way of indication in a recent article by M. ERMAN et al. in SPIE, Vol. 651, *Integrated Optical Circuit Engineering III*, (1986), p. 75.

We have cited GaAs and InP by way of example, but it is possible to selectively deposit ternary or quaternary alloys (GaInAsP) in using gas sources AsH$_3$, PH$_3$ and HCl in H$_2$ and solid sources Ga and In, again in setting up a state close to thermodynamic equilibrium in conditions of slight super-saturation.

If (again with respect to III-V compounds) we use a deposition method that works at atmospheric pressure and under conditions very far from thermodynamic equilibrium, such as MOCVD (metal organic chemical vapor deposition) for example, monocrystalline semiconducting material 34 is deposited on the exposed nucleation surfaces of the substrate 1, and polycrystalline material 30, 31, on the (dielectric or metallic) foreign surfaces 20, 21 as shown in FIG. 4 (see, for example, R. AZOULAY et al, *Journal of Crystal Growth*, 55, 1981, p w 229).

In this MOCVD method, the compound III source is metal organic (trimethylgallium, triethylgallium, trimethylindium, triethylindium etc.) while the compound V source is a hydride (AsH$_3$, PH$_3$ or other). It must be stated all the same that, under certain conditions and, again, in working under atmospheric pressure, a certain selectivity can be obtained by working with silica or tungsten bands with a width of less than 40 micrometers. However, this procedure is restrictive and difficult to use (see K. YAMAGUCHI et al., *Japanese Journal of Applied Physics*, Vol. 24, No. 12, 1985, p. 1666).

On the contrary, in working at reduced pressure (10 mm. on Hg column) and, again, in using the MOCVD method, K. KAMON et al. (Journal of Crystal Growth, 73.198573) have recently demonstrated that excellent deposition selectivity can also be obtained between an exposed (001) GaAs surface and a silicon nitride film (SiNx) deposited by plasma CVD at 250° C.; Although the method used (MOCVD) is located outside thermodynamic equilibrium, selectivity is obtained owing to a greater surface diffusivity, on the dielectric surfaces, of the products of decomposition of trimethylgallium (or trimethylindium) under the reduced pressure conditions used.

Finally, it may be noted that, by using the technique of molecular beam epitaxy (MBE) using metal organic compounds of gallium or indium (trimethylgallium or triethylindium, etc.), the same deposition selectivity is also obtained although it is very far from thermodynamic equilibrium. This is probably due to the same reasons of increased surface diffusivity on the dielectrical surfaces when the surrounding pressure is low (see for example, E. TOKUMITSU et al. *Journal of Applied Physics*, 55, 1984, p. 3163).

In short, the selective epitaxy of various III-V compounds (GaAs, InP, Ga In As, Ga In As P, etc) can be controlled by several distinct techniques, namely:

1. Vapor phase epitaxy (VPE) by the chlorides method;
2. Low pressure metal organic chemical vapor deposition (LP.MOCVD);
3. Metal organic molecular beam epitaxy (MOMBE).

Furthermore, the atmospheric pressure MOCVD method enables the deposition of continuous polycrystalline layers on the dielectric, and monocrystalline layers on the exposed surfaces of the substrate which is also monocrystalline.

In view of the foregoing description, it is seen that it is possible first of all to perform, by homo-epitaxy (or hetero-epitaxy of a compound having the same lattice parameter), stacks of monocrystalline III-V layers insulated by dielectric layers.

However, as indicated above, the main value of the method lies in the making of hetero-epitaxial structures which have no extended faults.

Referring to FIGS. 5 to 18 we shall therefore now describe a detailed example of the implementation of the method of the invention. This method concerns the making of monocrystalline thin layers of III-V compounds on a silicon substrate.

In a first step, a wafer 1 is made, for example of silicon, with an orientation (100) or (110) and a diameter of 4 or 5 inches as shown in FIG. 5.

In a second step shown in FIG. 6, a layer 2 is made of a dielectrical material SiO$_2$ obtained, for example, by thermal oxidation of the upper surface of the substrate 1.

In a third step shown in FIG. 7, a system of apertures 23, 24, is opened in the layer 2 in the form of parallel bands, for example, baring the substrate in these apertures between the dielectric bands 20, 21. The width of the apertures 23, 24, may be, for example, 0.5 to a few micrometers and the spacings 20, 21, may be a few micrometers to a few hundreds of micrometers. The orientation in the upper plane of the substrate of the bared substrate bands, will be done in such a way that, in view of the subsequently used selective deposition conditions, the lateral growth facet will not be restrictive.

In a fourth step (FIG. 8), monocrystalline silicon is made to grow by selective epitaxy (a mixture of SiH$_4$ +H$_2$ at 950° C. under atmospheric pressure for example) in the apertures 23, 24, on the bared substrate and polycrystalline silicon on the dielectric bands 20, 21. The set is planarized either naturally (faster growth in the monocrystalline apertures 23, 24 than in the bands 20, 21) or by making a selective deposition beforehand in the apertures 23, 24.

During a fifth step, a part of the silicon deposit made earlier is thermally oxidized. An variant may consist in the deposition, by a method known to those skilled in the art, of a layer 4 of dielectric such as SiO$_2$ or, better still, in view of the following operations, Si$_3$N$_4$.

However, preference may be given to thermal oxidation so as to subsequently provide III-V semiconducting interfaces of thermal silicon which is considered to be more abrupt. Thus, a structure such as the one shown in FIG. 9 is obtained.

In a sixth step, a thin layer 6 of silicon nitride Si$_3$N$_4$ is deposited on the layer 4 of thermal oxide. This thin layer 6 will have the effect of blocking the subsequent oxidation of the silicon at the places where this blocking is desired.

In a seventh step, apertures 63 are etched in the layer 6 of Si$_3$N$_4$ and the layer 4 of thermal silica. These apertures are etched at the same pitch as the apertures made during the third step, so that these apertures reach the monocrystalline silicon 34. A structure such as the one shown in FIG. 10 is obtained.

In an eighth step, the previously bared silicon in the central region of the band 63 is oxidated. Thus, a localized oxidation (a method of the LOCOS TYPE) is achieved as shown in FIG. 11. This localized oxidation has the effect of increasing the volume of the material as shown in FIG. 11. It must be noted that, as described above, the seventh step may be preceded by a deposition of a layer 6 of a non-oxidizing material (Si$_3$N$_4$ for example). The seventh chemical attack step is therefore also performed in his layer 6 which thus enables, during oxidation, the protection of the layer 4 (localized LOCOS type oxidation).

In a ninth step, a new system of bands is cut out in the layer 4 by etching. These bands are separated by apertures 43, 44 leading to the polycrystalline semiconductor 30, 31. These bands are offset with respect to the former ones and the offset may vary between a few microns and a few hundreds of microns. Moreover, these bands are centered with respect to the system of bands cut out during the step 3.

During a tenth step, through the apertures 43, 44, thus etched, the polycrystalline silicon is attacked by means of one of the reagents known to those skilled in the art. Once the polycrystalline silicon is removed, the attack is continued so as to make a recess 35 in the monocrystalline material. The bottom 38 of this recess is at a lower position than the upper plane of the first dielectric 20 so that a preliminary step of vertical growth is necessarily imposed before the step of lateral growth. Besides, it is to favor this preliminary vertical growth step that the eighth step of localized oxidation was performed beforehand. This means that there cannot be hetero-epitaxial lateral growth from the flank F of the cavity, since this cavity is formed by amorphous silica ($SiO_2$). We thus obtain a structure such as the one shown in FIG. 12.

In an eleventh step, using the mode of selective deposition and epitaxy under the conditions stated above (VPE, LP MOCVD, MOMBE), the previously hollowed cavities 30 and 35 are filled. As shown in FIG. 13, the filling is done first of all vertically in the cavity 35 and the faults generated at the interface between the monocrystalline silicon of the substrate 1 and the thin layer (III-V compound for example) will develop during this vertical growth until they meet a dielectric plane 20, 21 or 4, at which they will get blocked. Once the cavity 35 is filled, the growth can no longer take place except laterally as shown in FIG. 14, but will take place homo-epitaxially since the arriving vapor molecules will meet a seed of the same nature. Thus the growth of the layer in the space 30 can continue and the faults remain blocked by the dielectric planes 20, 21, or 4. Thus, a thin monocrystalline layer has been made to grow without extended faults between two bands of thermal silica as shown in FIG. 15.

In a twelfth step, the semiconducting material is planarized at the apertures 43, 44, (by localized attack for example) and the layer 4 of the dielectric is subjected to attack and ablation so as to obtain a plane layer of semiconducting material in the space 30.

However, an objection may be raised, namely that these extended faults generated in the planes forming, with the plane of FIG. 15, a dihedron of any angle (differing by 90° as shown) are capable of propagation in the thin layer in lateral growth. This situation is summarized in FIGS. 16, 17 and 18. FIG. 16 repeats a part of FIG. 15. The deposit obtained by lateral growth was planarized at the position of the apertures in the upper silica layer 4 (for example by attack in a $CF_4$ type plasma if it is a deposition of III-V compound semiconductor) and this upper layer of silica 4 was subsequently removed (twelfth step). We therefore have a monocrystalline thin layer 70 insulated from the substrate (except at its ends 71 and 72) by a thin layer of thermal silica 20, the set being supported by a silicon substrate.

FIG. 17 shows a view in perspective of FIG. 16, with a slight difference in that the thin layer has been completely insulated from the substrate by the etching of lateral bands 71 and 72 of nucleation made of highly defective material. FIG. 18 shows a section AA of FIG. 17 and shows that the extended faults DEF generated in the planes forming any dihedron with the plane of FIG. 16 have got propagated during lateral growth. The faults in this sectional view have been shown for reasons of simplification in a case where the hinge of the dihedron is formed by the intersection of the plane of FIG. 16 with the upper orientation plane of the substrate.

The invention also enables this drawback to be overcome by proposing a method to remove these faults. This method is disclosed in the process which shall now be described.

After performing the above described twelfth step, a thirteenth step is performed during which a dielectric layer 8 ($SiO_2$, $Si_3N_4$, etc. . . . ) is re-deposited on the monocrystalline thin layer 17 as shown in the perspective view of FIG. 19. FIG. 20 further shows a section of the structure obtained. The thickness of the insulating layer is, for example, $5 \times 10^{-2}$ to within a few microns typically.

During a fourteenth step, as shown in FIG. 21, apertures (83) are etched in the previous dielectric deposit and are oriented parallel to the trace (in the upper plane of the deposit) of the growth planes of the extended faults (twin joints, antiphase joints, etc.) In the particular example that we have chosen, the orientation of this system of apertures (83) is perpendicular to that of the systems of apertures (23, 24) made during the third step. However, it should be clearly noted that, depending on the nature and symmetry of the faults, the latter system of bands can be oriented by 60° or 120° with respect to the former one (that of the step 3) or according to any orientation, the essential point being that the trace of the plane of the extended faults in one of the confinement planes should be parallel to the large dimension of the bands of apertures (83). The width of the bands obtained and the pitch at which they are repeated have values which are quite similar to those used to make the bands of the third step or else those of the ninth step. The length of these bands is of the order of magnitude of the lateral dimension of the thin layers obtained during the eleventh step, and may reach some hundreds of microns. FIG. 22 shows a sectional view of FIG. 21.

In the fifteenth step, the faulty or twinned monocrystalline material 70 is attacked through the apertures 83 made earlier. Thus, a configuration similar to that preceding the eleventh step is found again (see FIG. 23).

In a sixteenth step, shown in FIG. 24, a homo-epitaxial thin layer is again made to grow under conditions of selective epitaxy (VPE, LP.MOCVD, MOMBE for III-V compounds) using seeds 75 and 76 that remain after the operation to remove the greatest part of the twinned thin layer 70 material. This step is similar to the previously described eleventh step. However, this second growth is done in a direction that forms an angle with the direction of growth of the eleventh step. More particularly, the growth front is substantially parallel to the trace of the plane of faults in a plane of one face of the one of the confinement layers.

During a seventeenth step, shown in FIG. 25, the part etched during the fifteenth step is filled so as to also fill the apertures 83 in the upper dielectric. If the apertures are too wide, additional stages are undertaken. These shall be described further below.

In an eighteenth step, after the planarizing of the monocrystalline thin layer (by chemical attack, plasma or localized oxidation), bands 85, 86 are opened in the upper dielectric 8 so as to bare the zones 75 and 76 which are still twinned. A structure such as the one shown in FIG. 26 is obtained.

In a nineteenth step, chemical attack is used to eliminate the zones 75 and 76 formed by faulty materials and the upper dielectric 8 is (if necessary) removed so as to obtain the regular blocks 9, indexed and without extended faults, of the monocrystalline thin layer (made of III-V compounds for example) on a thermal silica support 20. The size of these blocks (which may be a few $10^2 \times$ a few $10^2$ $\mu m^2$) is chosen by the user when the different technological steps are being performed. The structure obtained is shown in FIG. 27. It must be noted that the operation to eliminate extended faults may be performed a third time, etc. depending on the symmetry of growth of these faults.

Referring to FIGS. 28 to 34, we shall now describe a variant of the method of the invention.

During a first step, there is made, on a monocrystalline substrate 1, a layer 2 of a dielectrical material, and then, in a second step, bands 21 and 20 are etched on this layer, these bands being separated by apertures 24. The structure shown in FIG. 28 is obtained.

In a step shown in FIG. 29, in order to subsequently introduce a vertical growth step and to prevent the use of excessive thicknesses of silica (or of any other dielectric) grooves 29 are etched (by means known to those skilled in the art) in the subjacent substrate 1 at the location of the apertures 24. It should be noted, however, that it is possible to have only one initial structure such as the one shown in FIG. 28: this structure suffices, in effect, to introduce a vertical growth step.

In a fourth step, shown in FIG. 30, the previously opened grooves 29 are filled under conditions of selective epitaxy (VPE, LP.MOCVD, MOMBE for the III-V compounds) so as to introduce a vertical growth step during which extended faults are generated from different interfaces.

In a fifth step shown in FIG. 31, a thin layer 3 is deposited on the previous structure under normal conditions (MOCVD at atmospheric pressure for the III-V compounds for example). This layer 3 will be monocrystalline (but faulty all the same) on the monocrystalline part 39, and it will be polycrystalline (30, 31) on the dielectric. Furthermore, the structure obtained is plane.

In a sixth step shown in FIG. 32, a thin layer 4, which may or may not be insulating ($SiO_2$, $Si_3N_4$ etc.) is deposited on the previous structure using means known to those skilled in the art.

In a seventh step, shown in FIG. 33, an etching is made, in this insulating material, of a second system of bands 41, which will be offset by a few microns to a few hundreds of microns and arranged symmetrically with respect to the previous system of bands (24). The apertures (41) reach the zones of polycrystalline deposited material (31). From these apertures, the polycrystalline (31) deposited on the first dielectric during the fifth step is attacked so as to bare the monocrystalline seed 39.

During an eighth step, shown in FIG. 34, monocrystalline (possibly III-V) thin layer strips are made to grow again laterally by selective epitaxy using the seeds 39 bared during the previous stage. The propagation of the faults is, according to FIG. 34, blocked on the lower plane of the layer 4.

We thus obtain a uniform layer without any extended faults of monocrystalline semiconductor 70, of a different nature from that of the substrate, after performing, if necessary, a ninth step for the planarization of the semiconducting layer and for attacking the dielectric 42.

Furthermore, it is also possible to perform the previous method of the thirteenth step to the nineteenth step corresponding to FIGS. 17 to 27, so as to eliminate those faults which it was not possible to block during the previous lateral growth stage. This method of the thirteenth step to the nineteenth step can be repeated for a third time if necessary, and even for as many times as are needed for extended faults to be eliminated in all orientations.

It can be therefore seen that the invention concerns an method of epitaxial growth wherein:

(i) the growth is achieved through a chemical vapor deposition, (ii) the growth is channeled by two planes made of materials, which may be distinct, with a nucleation barrier which is higher than the seed to which they provide access and with a nucleation barrier which is as high as the thin layer undergoing growth through the chemical vapor deposition;

(iii) the growth is initiated by a vertical stage so as to enable the development of extended faults before the step of lateral growth proper which will produce the blocking of these very same extended faults.

According to an improvement of the method of the invention, enabling prevention of the upward overrunning of the growth film, there is provision, during the eleventh step described above with reference to FIG. 14, to stop the deposition of semiconductor when the growth reaches the apertures 43, 44. Thus, a structure of the type shown in FIG. 38 is obtained.

During a first ancillary stage shown in FIG. 39, the upper layer 4 of silicon is then removed, while masking, if necessary, the lower layers 20, 21.

During a second ancillary stage shown in FIG. 40, the structure is "planarized" by means of a polyimide type deposition done with a spinner for example (a machine for the deposition of photosensitive resins) and by using an etch back step if necessary.

During a third ancillary stage, shown in FIG. 41, a layer 90 of oxide ($SiO_2$) or nitride ($Si_3N_4$) is deposited at low temperature (LTO) by pyrolysis of $SiH_4 + H_2O$, plasma-assisted at 250° C. (for example) on the previously planarized structure.

In a fourth ancillary stage, apertures 93 are cut out in this latter layer of silica or nitride 90 so as to return to a structure identical to that obtained according to the description the tenth or fifteenth step above. The aperture in the silica is now compatible with accurate filling (without vertical overrun to obtain the junction of two crystallization fronts) of the empty bands between the bands of pyrolytic silica. During a fifth ancillary stage, the polyimide is dissolved by means of an appropriate solvent, and the lateral growth operation described in the eleventh step, as shown in FIG. 42, is repeated.

Different stages can also be planned as ancillary stages to the seventeenth step.

These ancillary stages are valuable when the (excessive) size of the spaces 30 and the thickness (too small) of the spaces necessitates relatively large-sized apertures to enable the passage of the growth gas.

Referring to FIGS. 43 to 50, we shall now describe another variant of the method of the invention.

According to this variant, a monocrystalline substrate 1 such as the one shown in FIG. 43 is used. On this substrate 1, successive depositions are made of a uniform layer of dielectric material 2 and a uniform layer 200 of a material having excellent chemical attack selectivity with respect to the dielectric 2, on the one hand, and with respect to the constituent material of the layer 300 (which shall be described hereinafter), on the other hand. This situation is summarized in FIG. 44.

According to FIG. 45, a system of bands 201, 202 is etched in the two above layers. These bands 201, 202 periodically bare the monocrystalline substrate 1 (seeds 16, 17). The width of these bands 201 and 202 ranges from 0.5 to a few microns typically, while the spaces 210, 220, 230 or 20, 21, 22 between two bands range from a few microns to a few hundreds of microns.

The bands 201 and 202 are filled by CVD under conditions of selective deposition and epitaxy, so as to obtain a semiconducting material (10, 11) with a different nature of substrate. This material is monocrystalline but faulty as shown in FIG. 46.

According to FIG. 47, a deposition is made, on the above structure, of a uniform layer 300 of a material having excellent chemical attack selectivity with respect to the material 200 and having, in addition, with respect to the "parent" gas phase, a nucleation barrier which is higher than the upper orientation plane of the substrate and that of the semiconducting material 10, 11. In other words, this material 300 (as also, besides, the dielectric 2) enables the obtaining, under the conditions used, of a selective deposition on the monocrystalline exposed surfaces of the substrate and of the semiconducting material which it is sought to obtain.

Bands 301, 302, having a width similar to the bands 201, 202 and spaced out by a few microns to a few hundreds of microns, are then opened in this deposit 300. These bands 301, 302 demarcate bands 310, 320 which lie, in their central region, on the monocrystalline semiconducting material 10, 11. Through these apertures 301, 302, the material 200 is attacked so as to dissolve the strips 210, 220, and 230. This situation, which is summarized in FIG. 48, has the consequence of baring seeds 18, 19, of the monocrystalline semiconducting material 10, 11.

It is then possible, as shown in FIG. 49, to again grow a thin layer of semiconductive material 170, 180, 190, by CVD, under selective conditions of deposition and epitaxy, using seeds 18, 19. Just as above, the propagation of extended faults will be blocked by the lower surface 37 of the strips 310, 320 and the thin layer of semiconducting material will subsequently have excellent crystalline quality.

Finally, as shown in FIG. 50, after planarization by localized attack in the windows 301, 302, the ablation of the layer 300 and insulation by elimination of the faulty bands 10 and 11, a monocrystalline thin layer is obtained, without any extended faults. This monocrystalline thin layer obtained is made of a semiconducting material (GaAs, InP In Sb . . . ) and is on a monocrystalline substrate with a different nature (Si for example), the electrical insulation between the thin layer and the substrate being achieved by the layer 20, 21, 22 of dielectric material. Referring to FIGS. 51 to 53, we shall now describe another variant of the method of the invention. This variant starts with the performance of the first, second and third steps of the general method, and then that of the following steps:

(a) - A uniform layer 200 is deposited; this layer 200 is made of a material having excellent attacking selectivity with respect to the dielectric, on the one hand, and the layer 300 (which shall be described hereinafter) on the other hand. This layer 200 may be made of amorphous silicon, a dielectric, a metal or else polyimide or an equivalent material.

(b) - A system of bands is etched in the previous layer so as to bare the substrate in the spaces left free by the etching of the first system of bands. The situation is shown in FIG. 51. It has been seen to it that the apertures made in the layers 200 are narrower than those of the first apertures and symmetrically arranged in the middle of these same first apertures.

(c) - A uniform layer 300 is re-deposited on the above structure, this layer 300 being made of a material with excellent attacking selectivity with respect to the material 200 and having, in addition, with respect to the "parent" gas phase, a nucleation barrier which is higher than the main crystallographic planes of the substrate and of the semiconductor which it is sought to obtain. The situation is shown schematically in FIG. 52.

From this situation, the ninth and tenth step of the general method are repeated. The layer 200 is dissolved according to the tenth step of the general method and a thin layer of semiconducting material is made to grown again, by CVD in conditions of selective epitaxy, from the seed formed by the upper face of the substrate, this re-growing being done according to the eleventh step of this very same general method (see FIG. 53).

According to the exemplary embodiment of FIG. 54, it is possible, by repeating the above-described method, to make a second and then a third similar structure and so on, on a structure obtained by the above methods. It is also possible to obtain an alternation of thin layers of monocrystalline and insulating semiconductors. These thin layers may be formed by the same monocrystalline semiconducting material (for example GaAs or In P) on a different substrate (for example silicon), but it is quite clear that it is also possible to obtain thin layers having different natures from one another. Thus, and strictly as a non-exhaustive example, the substrate 1 may be made of silicon, the layer A of gallium arsenide (GaAs), the layer B of indium phosphide (InP) and the layer C of indium antimonide (InSb). FIG. 54 has been shown with a stacking of three monocrystalline thin layers on a substrate which is also monocrystalline. It is quite clear that this stacking can be continued, and that the final structure may differ slightly from the drawing of this figure. A system of semiconductor bands on insulating material can thus be made, and the seeding zones can be superimposed or offset.

In making active components on the initial substrate and successively on each semiconductor level, a three-dimensional integrated circuit is obtained, the level j of the circuits being prepared without damaging the level j−1 which has already been made and processed, because of the relatively low temperature used in the CVD process.

In all the descriptions disclosed until now, the confinement of the thin layer in lateral growth has been done by means of various depositions (possibly oxidated) and photo-etchings.

The role of these different deposition operations was to give the base for the building of the confinement surfaces. However, it must be clearly noted that it is possible to use any other operation or series of operations that can lead to the formation of a lateral channel enabling, on the one hand, a "parent" gas phase to reach a nucleation zone and, on the other hand, to achieved a confined monocrystalline growth from this nucleation zone.

Thus, FIGS. 35 to 37 propose a slightly different method to make the confinement surfaces. This method starts with a localized epitaxy 500 (homo-epitaxy or hetero-epitaxy) on a substrate 1 after preliminary deposition of dielectric 501 and etching of bands in this dielectric (see FIG. 35). Then a mask 502 is positioned on this substrate. In this mask, a system of parallel bands 503 has been opened. This mask is formed by or lined with a material having a higher nucleation barrier than the layer that it is sought to grow. Then, the lateral growth operation is performed using seeds 500 obtained by localized epitaxy, the confinement volume 30 being limited in its upper part by the lower plane (504) of the mask 502 and, in its lower part, by the dielectric deposited on the substrate. The situation is shown schematically in FIG. 36.

As shown in FIG. 37, it is also possible to use a movable mask 502 which will be shifted with the rate of growth of the lateral front. This enables the making of layers of greater size.

The method of the invention can be applied to the making of monocrystalline thin layers of semiconducting materials on amorphous or polycrystalline insulating materials. It may enable the making of special structures (dual-gate field-effect transistors, permeable base transistors, hetero-structures and lateral superlattices).

The method of the invention thus enables the achieving of growth with semiconductors having different natures, and the obtaining of hetero-epitaxial structures wherein the different layers are nonetheless monocrystalline and have neither dislocations nor fault planes.

It is clear that the above description has been made purely by way of a non-restrictive example. Other alternative methods may be envisaged without going beyond the scope of the invention. The numerical values have been given solely to illustrate the description. Besides, the application to a semiconductor-based structure, as indicated in the description, has been given purely by way of example. The invention can also be applied, on a general basis to any structure based on semiconductors of different types.

What is claimed is:

1. A method for the fabrication of a thin monocrystalline layer of a semiconducting material, through growth by chemical vapor deposition (CVD), wherein crystal growth is initiated on at least one seed having a chemical composition which is the same or is different from that of the semiconducting material of the thin layer to be obtained, said crystal growth being confined within a space located between two confinement layers each made of a material different from the semiconducting material of the thin layer in such a way that there can be neither nucleation nor deposition of semiconducting material on exposed surfaces of the two confinement layers, the space between the two confinement layers defining the thickness of the semiconductor monocrystalline thin layer to be obtained,
wherein making the seed of monocrystalline semiconducting material comprises the steps of:
depositing, on a substrate, of a first confinement layer;
etching in the first confinement layer at least one aperture;
selectively growing a first semiconducting material, the first semiconducting material being monocrystalline in the aperture and polycrystalline on the first confinement layer; and
covering the first semiconducting material by a second confinement layer in which at least one aperture is made and the polycrystalline semiconducting material is removed therethrough.

2. A fabrication method according to claim 1, wherein the space is defined by adjacent faces of the two confinement layers, the seed communicating with the space, the growth of the monocrystalline material being done initially in a direction perpendicular to a first plane defined by at least one of the two confinement layers until it reaches at least one of the faces or the first plane, the growth then continuing in the space, in a first predefined direction, between the two confinement layers.

3. A fabrication method according to claim 2, wherein the seed communicates with the space, either by at least one conduit made of a material of the same type as that of the two confinement layers or by a lateral aperture which may be blocked by faulty, monocrystalline, semiconducting material.

4. A fabrication method according to claim 2 wherein, after said thin layer of monocrystalline material is obtained, an aperture is made in one of said confinement layers, said aperture is being oriented in a direction which is substantially parallel to a trace of planes of residual faults in either of planes corresponding to surfaces of the confinement layers, the monocrystalline material being partly removed between the two layers of confinement, at least one seed of this material being preserved, another monocrystalline growth being made between the two confinement layers in a direction of growth which is substantially perpendicular to the trace of the residual planes of the faults in either of the planes corresponding to the surface of the confinement layers.

5. A method according to claim 1, wherein the etching of at least one aperture in the first confinement layer also etches an aperture in the substrate.

6. A method for the fabrication of a thin monocrystalline layer of a semiconducting material, through growth by chemical vapor deposition (CVD) wherein crystal growth is initiated on at least one seed having a chemical composition which is the same or is different from that of the semiconducting material of the thin layer to be obtained, said crystal growth being confined within a space located between two confinement layers each made of a material different from the semiconducting material of the thin layer in such a way that there can be neither nucleation nor deposition of semiconducting material on exposed surfaces of the two confinement layers, the space between the two confinement layers defining the thickness of the semiconductor monocrystalline thin layer to be obtained, said method comprising the following steps:
a first step for making a first layer of insulating material on the monocrystalline semiconducting substrate;
a second step for etching first apertures in the first layer of insulating material;
a third step for making, by CVD, a first layer of semiconducting material in the first apertures and on parts of the first layer of insulating material that remain after the previous etching step, said first layer of semiconducting material being polycrystalline on the first layer of insulating material;
a fourth step for making a second layer of an insulating material on the first layer of semiconducting material;

a fifth step for etching, in the second layer of insulating material, at least one second aperture ending in a monocrystalline part of the first layer of semiconducting material;

a sixth step for oxidizing the monocrystalline part of the first layer of semiconducting material exposed in the fifth step;

a seventh step for etching, in the second layer of insulating material, at least one third aperture ending on a polycrystalline part of the first layer of semiconductor material;

an eighth step for chemically attacking, through the third aperture, the polycrystalline part of the first layer of semiconducting material so as to eliminate all the polycrystalline part of the first layer of semiconducting material, said attacking process being continued to etch and remove at least some of the monocrystalline part of the first layer of semiconducting material so as to reach and etch the monocrystalline substrate beneath the level of an upper face of the first layer of insulating material; and a ninth step for growing, by selective epitaxy, through chemical vapor deposition, a second monocrystalline semiconductor material, in a space etched during the eighth step, said growth being achieved along a first direction of growth.

7. A method according to claim 6, wherein the fifth step is preceded by a step for depositing a non-oxidizing material, the fifth step being performed also in the non-oxidizing material.

8. A method according to claim 6, further comprising:
a tenth step for removing the second layer of insulating material.

9. A method according to claim 7, further comprising:
an eleventh step for making, on the entire structure, a third layer of insulating material followed by etching a fourth aperture in said third layer of insulating material which is oriented in parallel to at least one trace, in a plane of one of the confinement layers, of at least one fault plane existing in the second monocrystalline semiconducting material, and which bares the second monocrystalline semiconducting material obtained in the ninth step;

a twelfth step for attacking and removing, through said fourth aperture, a portion of the second monocrystalline semiconducting material; and a thirteenth step for growing a third monocrystalline semiconducting material in a space defined during the twelfth step.

10. A method according to claim 9, further comprising:
a fourteenth step for removing the third layer of insulating material made during the eleventh step, whereafter the eleventh, twelfth and thirteenth steps are repeated in providing, during the eleventh step, for an aperture oriented in parallel to another trace in a confinement plane of another type of fault plane existing in the second layer of monocrystalline, semiconducting material.

11. A method according to claim 9, further comprising:
a fourteenth step for removing the third layer of insulating material covering the structure; and a fifteenth step for removing, in the third layer of semiconducting material, zones of semiconducting material having dislocations and other extended faults.

12. A method for the fabrication of a thin monocrystalline layer of a semiconducting material, through growth by chemical vapor deposition (CVD) wherein crystal growth is initiated on at least one seed having a chemical composition which is the same or is different from that of the semiconducting material of the thin layer to be obtained, said crystal growth being confined within a space located between two confinement layers each made of a material different from the semiconducting material of the thin layer in such a way that there can be neither nucleation nor deposition of semiconducting material on exposed surfaces of the two confinement layers, the space between the two confinement layers defining the thickness of the semiconductor monocrystalline thin layer to be obtained, comprising the following steps:

a first step for making, on a substrate, at least one band of dielectric material;

a second step for coating the at least one band by a material displaying a selectivity of chemical attack with respect to the semiconducting materials and dielectric materials;

a third step for coating the substrate and coated bands by an encapsulating material;

a fourth step for making apertures in the encapsulating material on top of the at least one band of dielectric material;

a fifth step for eliminating, through the apertures, the material having a chemical attacking selectivity; and a sixth step for selectively growing through the apertures a monocrystalline semiconducting material.

13. A method for the fabrication of a thin monocrystalline layer of a semiconducting material, through growth by chemical vapor deposition (CVD) wherein crystal growth is initiated on at least one seed having a chemical composition which is the same or is different from that of the semiconducting material of the thin layer to be obtained, said crystal growth being confined within a space located between two confinement layers each made of a material different from the semiconducting material of the thin layer in such a way that there can be neither nucleation nor deposition of semiconducting material on exposed surfaces of the two confinement layers, the space between the two confinement layers defining the thickness of the semiconductor monocrystalline thin layer to be obtained, comprising the following steps:

a first step for making, on a substrate, at least one band of dielectric material;

a second step for coating the at least one band by an interposed, semiconducting material displaying a selectivity of chemical attack with respect to the dielectric material;

a third step for coating the substrate and coated bands by an encapsulating material having a selectivity of chemical attack with respect to the at least one band and interposed material and permitting neither nucleation not deposition through species of said chemical vapor deposition on its surface exposed to the chemical vapor deposition;

a fourth step for making apertures in the encapsulating material on top of the at least one band of dielectric material.

a fifth step for eliminating, through the apertures, the semiconducting, interposed material; and a sixth step for selective growth and epitaxy through the apertures of a monocrystalline semiconducting material.

14. A method for the fabrication of a thin monocrystalline layer of a semiconducting material, through growth by chemical vapor deposition (CVD) wherein crystal growth is initiated on at least one seed having a chemical composition which is the same or is different from that of the semiconducting material of the thin layer to be obtained, said crystal growth being confined within a space located between two confinement layers each made of a material different from the semiconducting material of the thin layer in such a way that there can be neither nucleation nor deposition of semiconducting material on exposed surfaces of the two confinement layers, the space between the two confinement layers defining the thickness of the semiconductor monocrystalline thin layer to be obtained, wherein making the seed of monocrystalline, semiconducting material comprises the following steps:
   depositing on a substrate a first confinement layer and then an interposed layer;
   etching in the first confinement layer and the interposed layer at least one first aperture;
   growing a seed of monocrystalline semiconducting material in said first aperture;
   depositing a second confinement layer;
   making at least one second aperture in the second confinement layer and removing the interposed layer;
   wherein said interposed layer has an attack selectivity with respect to the first and second confinement layers.

15. A method for the fabrication of a thin monocrystalline layer of a semiconducting material, through growth by chemical vapor deposition (CVD) wherein crystal growth is initiated on at least one seed having a chemical composition which is the same or is different from that of the semiconducting material of the thin layer to be obtained, said crystal growth being confined within a space located between two confinement layers each made of a material different from the semiconducting material of the thin layer in such a way that there can be neither nucleation nor deposition of semiconducting material on exposed surfaces of the two confinement layers, the space between the two confinement layers defining the thickness of the semiconductor monocrystalline thin layer to be obtained, comprising the steps of:
   making a first confinement layer on a substrate, said confinement layer including at least one first aperture with, in the first aperture, a block of monocrystalline semiconducting material emerging above the first confinement layer, by a height corresponding to the thickness of the monocrystalline layer to be obtained; and
   placing a mask, having at least one second aperture and a face in contact with the block;
   wherein a semiconducting material is epitaxially grown through the second aperture so that there is growth of a monocrystalline layer from the block between the first confinement layer and the face of the mask.

16. A method according to claim 15, wherein the mask is movable with respect to the block, in parallel to a surface of the first confinement layer.

* * * * *